(12) United States Patent
Oda et al.

(10) Patent No.: US 6,477,284 B1
(45) Date of Patent: Nov. 5, 2002

(54) PHOTO-ELECTRIC COMBINED SUBSTRATE, OPTICAL WAVEGUIDE AND MANUFACTURING PROCESS THEREFOR

(75) Inventors: Mikio Oda, Tokyo (JP); Sakae Kitajo, Tokyo (JP); Yuzo Shimada, Tokyo (JP); Masataka Itoh, Tokyo (JP); Yoshinobu Kaneyama, Tokyo (JP); Masahiko Fujiwara, Tokyo (JP)

(73) Assignee: NEC Corporation, Tokyo (JP)

( * ) Notice: Subject to any disclaimer, the term of this patent is extended or adjusted under 35 U.S.C. 154(b) by 66 days.

(21) Appl. No.: 09/593,128

(22) Filed: Jun. 13, 2000

(30) Foreign Application Priority Data

Jun. 14, 1999 (JP) .......................................... 11-167222
Jun. 17, 1999 (JP) .......................................... 11-171096
Jun. 24, 1999 (JP) .......................................... 11-178766

(51) Int. Cl.[7] ................................................. G02B 6/12
(52) U.S. Cl. ............................................ 385/14; 385/88
(58) Field of Search .............................. 385/49, 50, 14, 385/130, 88–94; 257/431, 432, 433, 81, 99, 98

(56) References Cited

U.S. PATENT DOCUMENTS

| | | | |
|---|---|---|---|
| 5,214,723 A | * 5/1993 | Zamkotsian | 385/2 |
| 5,416,861 A | * 5/1995 | Koh et al. | 385/14 |
| 5,513,073 A | 4/1996 | Block et al. | 361/719 |
| 5,644,667 A | 7/1997 | Tabuchi | 385/49 |
| 5,737,458 A | * 4/1998 | Wojnarowski et al. | 385/15 |
| 5,764,832 A | 6/1998 | Tabuchi | 385/49 |
| 5,862,276 A | * 1/1999 | Karras | 385/30 |
| 5,972,516 A | 10/1999 | Kaneko et al. | 428/429 |
| 6,243,509 B1 | * 6/2001 | Chen | 385/14 |

FOREIGN PATENT DOCUMENTS

| | | |
|---|---|---|
| JP | 62-174996 | 7/1987 |
| JP | 1-269903 | 10/1989 |

(List continued on next page.)

OTHER PUBLICATIONS

Koji Enbutsu et al; Multimode Polymeric Optical Waveguides with High Thermal Stability Using UV Cured Epoxy Resins; NTT Opto–Electronics Laboratories, Tokai, Naka–Gun, Ibaraki, 319–11 Japan; MOC/GRIN '97 Tokyo; p. 394–397.

Tohru Matsuura et al. Polyimides for Optical Waveguides and Their Optical Device; Applications; NTT Science and Core Technology Laboratory Group; NTT Opto–Electronics Laboratories; MES'97, p. 77–80 (No Abstract).

(List continued on next page.)

*Primary Examiner*—Hemang Sanghavi
*Assistant Examiner*—Scott Knauss
(74) *Attorney, Agent, or Firm*—Foley & Lardner

(57) ABSTRACT

The present invention provides a photo-electric combined substrate comprising an electric interconnection part having an electric interconnection layer and an electric insulating layer as well as an optical waveguide part consisting of a core and a clad, where the electric insulating layer in the electric interconnection part and the optical waveguide part are made of the same material; a ceramic substrate comprising an optical device and an electric device where a ceramic substrate has a concave where the concave is filled with a resin, and where at least an optical device is mounted on the ceramic substrate while an electric device on the resin in the substrate concave; and an optical waveguide comprising a core and a clad having a refractive index lower than that of the core, where the core is made of a fluorene-unit-containing epoxy acrylate resin.

11 Claims, 15 Drawing Sheets

FOREIGN PATENT DOCUMENTS

| | | |
|---|---|---|
| JP | 3-245586 | 11/1991 |
| JP | 4-172307 | 6/1992 |
| JP | 4-292611 | 10/1992 |
| JP | 6-222230 | 8/1994 |
| JP | 6-275870 | 9/1994 |
| JP | 6-310833 | 11/1994 |
| JP | 7-294783 | 11/1995 |
| JP | 8-307063 | 11/1996 |
| JP | 9-236731 | 9/1997 |
| JP | 9-318831 | 12/1997 |
| JP | 10-48443 | 2/1998 |
| JP | 10-170738 | 6/1998 |
| JP | 10-247742 | 9/1998 |
| JP | 11-52193 | 2/1999 |
| JP | 2001-4858 | 1/2001 |

OTHER PUBLICATIONS

Fusai Shimokawa et al., Fabrication of Fluroinated Polyimide Waveguides on Copper–Polyimide Multilayer Substrates for Opto–Electronic Multichip Modules; NTT Interdisciplinary Research Laboratories, Nippon Telegraph and Telephone Corporation; Musasahino–Shino 3–9–11, Tokyo 180, Japan; p. 705–710.

* cited by examiner

PHOTO-ELECTRIC COMBINED SUBSTRATE, OPTICAL WAVEGUIDE AND MANUFACTURING PROCESS THEREFOR

BACKGROUND OF THE INVENTION

1. Field of the Invention

This invention relates to a photo-electric combined substrate having a photo-electric transducing function used in, e.g., optical communication, in which an optical waveguide is combined with an electric interconnection, and a manufacturing process therefor.

This invention also relates to an optical waveguide, in particular an optical waveguide with a higher heat resistance and a higher economic efficiency which can be manufactured by a relatively convenient process, and to a manufacturing process therefor.

2. Description of the Prior Art

Apparatuses such as an optical exchanger and a photo-interconnection device have been intensely investigated and developed for achieving large-capacity and high-speed communication. These apparatuses comprise an electric signal processing portion, an optical signal processing portion, and a transducing portion of an electric signal to an optical signal or vice versa. The transducing portion comprises a photo-electric transducing device (optical device) such as a laser diode (LD) and a photodiode (PD), and an electric element for operating the optical device or amplifying the signal.

In a conventional photo-interconnection, a silicon substrate is, in the light of its properties, used as a substrate on which an optical waveguide is formed and an optical device is mounted, while a ceramic substrate or printed board is frequently used as a substrate on which an electric interconnection is formed and an electric device is mounted. These substrates are mutually connected via a bonding wire in a manner that the substrate for the optical device is placed over the electric substrate.

In the conventional technique where the substrate on which an optical waveguide is formed and an optical device is mounted, is connected, via a bonding wire, with the substrate on which an electric interconnection is formed and an electric device is mounted, however, the wire is relatively longer. Therefore, when increasing an operating frequency for increasing a transmission capacity, a noise is overlaid on a signal. Thus, a higher frequency cannot be achieved.

In an attempt for solving the problem, several techniques have been proposed, in which both optical and electric devices are mounted on a single substrate; for example, JP-A 9-236731 has disclosed a ceramic substrate on which both optical and electric devices are mounted.

When both electric and optical devices are mounted on a ceramic substrate and these devices are closely mounted for high-speed operation of the optical device, the ceramic is responsible for heat insulation. However, a ceramic does not have a sufficiently low heat conductivity to prevent thermal interference between the electric and the optical devices.

On the other hand, when an optical device is mounted on a resin heat-insulating material on a ceramic substrate, the resin is so soft that an optical axis tends to be not in the right position.

For high-speed operation of an optical device, it is necessary to reduce the length of the electric interconnection between the electric and the optical devices. When the electric device and the optical device are mounted by separate methods, there is a restriction in reducing the length of the electric interconnection between the electric and the optical devices. There are also limitations in densification of, e.g., the electric and the optical devices.

A combined substrate described above has a configuration where an optical waveguide consisting of a siloxane polymer is formed on a ceramic multilayer interconnection substrate. Thus, when the interconnection substrate and the optical waveguide are made of different materials, it is necessary to form the electric insulating layer of the interconnection substrate and the optical waveguide with different materials by separate processes. It has been, therefore, difficult in the combined substrate to realize a complete three-dimensional combination or an adequately reduced cost for the optical waveguide and the electric interconnection. Furthermore, for a siloxane polymer used as a resin for an optical waveguide in the combined substrate, it is difficult to form a fine interconnection or a via-hole by photolithography process. The polymer cannot be, therefore, as a material for an electric insulating film.

In JP-A 3-245586, a semiconductor laser device is mounted on a resin such as a fluororesin (Teflon; trade mark) as an insulating material for preventing heat from being transferred from an electric device to the semiconductor laser device as an optical device.

Among others, an optical waveguide made of a resin has been intensely investigated and developed because it can be formed by a low-temperature and low-cost process into various types of substrates, leading to reduction in an overall cost for an optical module.

For example, F. Shimokawa et al., In Pr43rd ECTC (1993), p.705–710 and T. Matsuura et al., MES'97 (the Seventh Microelectronics Symposium), p.77–80 have disclosed an example where a fluorinated polyimide is used as a material for forming an optical waveguide.

According to these publications, the fluorinated polyimide is applied on a substrate and then heated to 300 to 400° C. to form a film. Then, the optical waveguide core is processed into a desired shape by reactive ion etching. A copolymerization ratio between two polyimides can be varied to adjust a refractive index. The glass-transition temperature of the fluorinated polyimide is about 300° C.

Furthermore, K. Enbutsu et al., MOC/GRIN '97 Tech Digest, P3, p.394 and 1998 Electronic Information Communication Association Electronics Society Meeting Proceeding C-3-69 have disclosed an example where an ultraviolet (UV) curable resin (photosensitive epoxy resin) is used as a material for forming an optical waveguide.

As indicated in these publications, an ultraviolet curable resin has an advantage that only the core of the optical waveguide can be irradiated with UV to be cured into a desired shape. A main component in the UV curable resin can be varied to adjust a refractive index. The glass-transition temperature of the UV curable resin is about 250° C.

In JP-A 10-170738, an optical waveguide is made of an asymmetric-spiro-ring containing epoxy acrylate resin.

However, when a fluorinated polyimide is used as a material for an optical waveguide, reactive ion etching is employed in forming the optical waveguide into a desired shape, leading to a longer etching duration, and thus it cannot be conveniently formed. In addition, available substrate materials are limited due to process factors such as a higher deposition temperature. Furthermore, a fluorinated polyimide has a disadvantage of a higher material cost.

On the other hand, an UV curable resin can be used to conveniently form a core shape because only UV irradiation is required. It is, however, used for a multi-mode optical waveguide whose core cross section has a width and a height of several ten micrometers because of an insufficient resolution for forming a fine pattern. Thus, it is not be applied to a single-mode optical waveguide whose core cross section has a width and a height of about several micrometers.

Furthermore, the UV curable resins as described in the prior art publications have a glass-transition temperature of about 250° C., so that it cannot endure an optical device mounting step (about 300° C.) using a gold/tin solder (melting point: 280° C.) having a self-alignment effect, i.e., an effect that an optical device is drawn to a desired position by surface tension of a solder ball.

SUMMARY OF THE INVENTION

An object of this invention is to provide a photo-electric combined substrate in which an optical waveguide and an electric interconnection can be three-dimensionally combined with a reduced cost, and a manufacturing process therefor.

Another object of this invention is to provide a ceramic substrate comprising an optical device and an electric device which can operate with a high speed.

Another object of this invention is to provide a material for an optical waveguide which has good optical transparency at communication frequencies of 1.3 and 1.55 $\mu$m and adequate heat resistance and can be conveniently shaped.

In the first aspect, it provides a photo-electric combined substrate comprising an electric interconnection part having an electric interconnection layer and an electric insulating layer as well as an optical waveguide part consisting of a core and a clad, where the electric insulating layer in the electric interconnection part and the optical waveguide part are made of the same material.

The photo-electric combined substrate of this aspect described above allows the electric interconnection part and the optical waveguide part to be formed by the same process, so that the optical waveguide part and the electric interconnection part can be three-dimensionally mounted and the photo-electric combined substrate can be prepared with a reduced cost.

The electric interconnection part and the optical waveguide part may be formed as separate structures.

Alternatively, the optical waveguide part may be placed on the electric interconnection part, or the optical waveguide part may be formed in the electric insulating layer of the electric interconnection part, which allows the photo-electric combined substrate to be further densified.

The material for the above-mentioned electric insulating layer and the optical waveguide may be a photosensitive resin whose refractive index depends on an exposure dose, and the core of the optical waveguide may be formed by scanning an exposure light while focusing on a desired position in the photosensitive resin such that the refractive index of the part to be the core of the photosensitive resin is higher than that of the part to be the clad of the photosensitive resin.

Moreover, the electric interconnection part and the optical waveguide part may be formed on the same substrate.

The above substrate may be a ceramic substrate, a single-layer interconnection substrate or a multilayer interconnection substrate.

This aspect also provides a process for manufacturing a photo-electric combined substrate comprising an electric interconnection part having an electric interconnection layer and an electric insulating layer as well as an optical waveguide part consisting of a core and a clad, which comprises steps of forming the electric interconnection part and forming the optical waveguide part, where the electric insulating layer in the electric interconnection part and the optical waveguide part are made of the same material.

It allows the electric interconnection part and the optical waveguide part to be formed by the same process. Furthermore, the optical waveguide part can be three-dimensionally mounted with the electric interconnection part, and the photo-electric combined substrate can be prepared with a reduced cost.

The steps of forming the electric interconnection part and forming the optical waveguide part may comprise the step of forming the electric interconnection part and the optical waveguide part as separate structures.

The step of forming the electric interconnection part and the optical waveguide part as separate structures may comprise the steps of depositing the material while separately forming the electric interconnection part and the optical waveguide part in given areas of the deposited material, and removing the deposited material where the electric interconnection part or the optical waveguide part is not to be formed.

The step of forming the optical waveguide part may comprise the step of forming the optical waveguide part on the electric interconnection part. Alternatively, in terms of the steps of forming the electric interconnection part and forming the optical waveguide part, the optical waveguide part may be formed in the electric insulating layer of the electric interconnection part during forming the electric interconnection part. It provides a further-densified photo-electric combined substrate.

The process of this aspect may comprise the step of forming the core of the optical waveguide part by scanning an exposure light while focusing on a desired position in the photosensitive resin such that the refractive index of the part to be the core of the photosensitive resin is higher than that of the part to be the clad of the photosensitive resin, using a photosensitive resin whose refractive index depends on an exposure dose.

The process of this aspect may comprise the step of forming the electric interconnection part and the optical waveguide part on the substrate and the substrate may be a ceramic substrate, a single-layer interconnection substrate or a multilayer interconnection substrate.

In the second aspect of the present invention, it provides a ceramic substrate having a concave where the concave is filled with a resin, and where at least an optical device is mounted on the ceramic substrate while an electric device on the resin in the substrate concave. Particularly, on the resin-filled concave, a fine electric interconnection layer using the resin as an electric insulating layer is formed.

This aspect also provides a process for manufacturing the above ceramic substrate comprising an optical device and an electric device, comprising the steps of forming a concave on a ceramic substrate; filling a resin in the concave; and mounting an optical device on the ceramic substrate while mounting an electric device on the resin filled in the concave.

An optical device, particularly a light emitting diode such as an LD significantly susceptible to heat may be mounted on a ceramic substrate while an electric device on a resin filled in a concave on the ceramic substrate. It can prevent thermal interference between the electric and the optical devices and thus it hardly brings about misalignment of an optical axis. Furthermore, the surfaces of the ceramic substrate and of the resin filled in the concave may be at the same level to reduce the wiring length between the electric and the optical devices and to further promote densification. In particular, a fine electric interconnection layer may be formed in the concave using the resin filled in the concave as an electric insulating layer and then an electric device may be mounted on the interconnection layer to meet the need of an electric device with a finer interconnection.

In the third aspect of the present invention, it provides an optical waveguide comprising a core and a clad having a refractive index lower than that of the core, where the core is made of a fluorene-unit-containing epoxy acrylate resin.

The clad is preferably made of a fluorene-unit-containing epoxy acrylate resin whose refractive index is lower than the material for the core.

The core or both of the core and the clad formed using the fluorene-unit-containing epoxy acrylate resin preferably have a glass-transition temperature of 260° C. or higher, a light propagation loss of 0.5 dB/cm or less at a wavelength of 1.3 μm, and a light propagation loss of 0.5 dB/cm or less at a wavelength of 1.55 μm.

A particularly preferable fluorene-unit-containing epoxy acrylate resin described above is, for example, the following compound represented by formula (1):

exposing and etching the fluorene-unit-containing epoxy acrylate resin layer to form a core (Step 3); and post-baking the substrate comprising the core (Step 4).

For forming a fluorene-unit-containing epoxy acrylate resin layer as the lower clad layer in the above Step 1, the fluorene-unit-containing epoxy acrylate resin layer is formed; then the resin layer is exposed with a dose more than that during the step of forming the core to control the refractive index of the lower clad layer to be lower than the refractive index of the core, and then the substrate comprising the lower clad layer is post-baked.

After the above Step 4, for forming a fluorene-unit-containing epoxy acrylate resin layer as an upper clad layer covering the core layer, the fluorene-unit-containing epoxy acrylate resin layer is formed; then the resin layer is exposed with a dose more than that during the step of forming the core to control the refractive index of the upper clad layer to be lower than the refractive index of the core, and then the substrate comprising the upper clad layer is post-baked.

The post baking may be conducted at a temperature of 160 to 250° C.

The material for the optical waveguide according to the third aspect has the following features; first, it has a good optical transparency at communication wavelengths of 1.3 and 1.55 μm; second, it has a glass-transition temperature of 260° C. or higher, i.e., exhibits higher heat resistance; third,

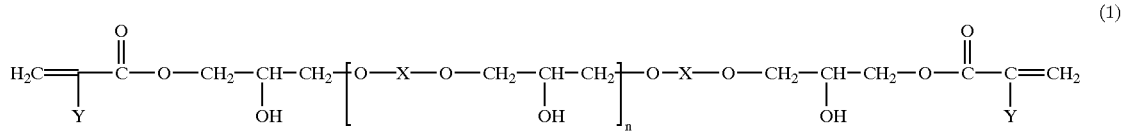

wherein X is the chemical structure represented by formula (2), Y is hydrogen or methyl, and n is an integer of 0 or more:

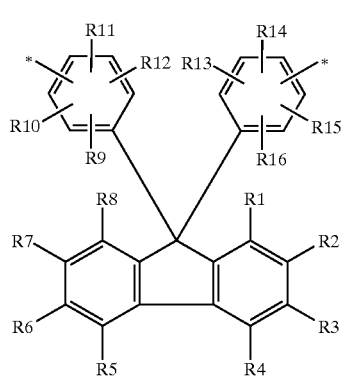

wherein *s in the benzene rings indicate bonding positions to the chemical structure X in formula (1), and the positions * may be independently selected from ortho-, meta- and para-positions to the bonding position of the fluorene unit with the benzene rings; R1 to R16 are independently selected from a hydrogen atom, an alkyl group, an alkoxy group, an alkoxycarbonyl group, an aryl group and an aralkyl group.

This aspect of the present invention also provides a process for manufacturing an optical waveguide, comprising the steps of:

forming a lower clad layer on a substrate (Step 1);

forming a fluorene-unit-containing epoxy acrylate resin layer on the lower clad layer (Step 2);

it is curable by UV irradiation owing to its epoxy acrylate groups, so that the core may have a cross section having a height and a width of several to several ten micrometers by UV exposure and development and thus the core may be readily formed; fourth, the refractive index of the fluorene-unit-containing epoxy acrylate resin may be controlled within an appropriate range by controlling an exposure dose, so that using the same material, a layer can be formed and then the clad and the core can be formed only by adjusting an exposure dose; and fifth, in contrast to a fluorinated polyimide, the film-formation of the resin requires a relatively lower temperature, resulting in a low-temperature process.

As described above, a fluorene-unit-containing epoxy acrylate resin can be used as a material for an optical waveguide to conveniently form a heat-resistant optical waveguide.

DETAILED DESCRIPTION OF PREFERRED EMBODIMENTS

Several embodiments of the first aspect according to this invention will be described with reference to the drawings.

(Embodiment 1)

Figure 1:
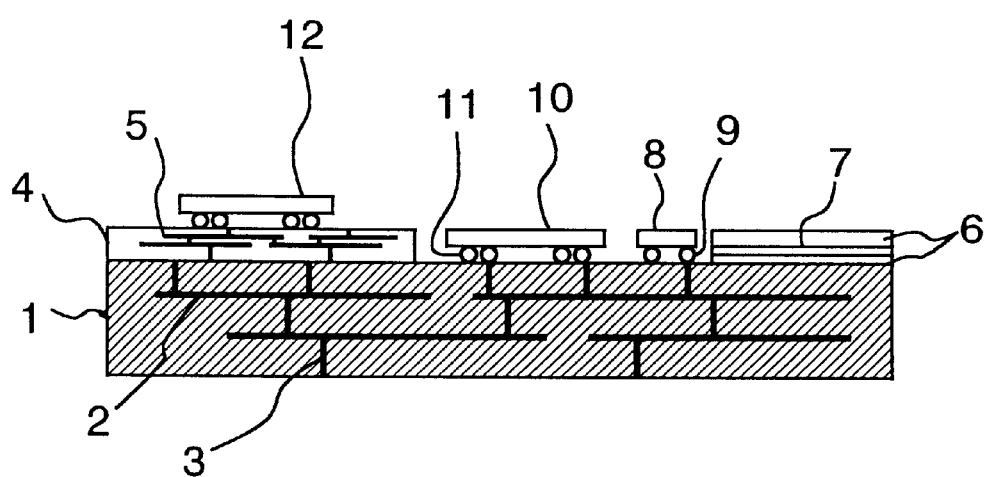
FIG. 1 is a cross section illustrating the first embodiment of a photo-electric combined substrate according to the first aspect of this invention.

FIG. 1 is a cross section illustrating the first embodiment of a photo-electric combined substrate according to the first aspect of this invention.

The photo-electric combined substrate (hereinafter, referred to as a "combined substrate") of this embodiment comprises a ceramic multilayer interconnection substrate 1 where an electric interconnection is formed on both surfaces and its inside via a copper interconnection 2 and an interlayer via hole 3; a fine interconnection part on the ceramic multilayer interconnection substrate 1 which consists of an electric insulating layer 4 and a fine copper interconnection 5; and an optical waveguide also on the ceramic multilayer interconnection substrate 1 which consists of an optical waveguide clad layer 6 and an optical waveguide core layer 7. On the ceramic multilayer interconnection substrate 1 are mounted an LD (laser diode) 8 via a high-melting solder bump 9 and a driver silicon LSI 10 via a solder bump 11. A control silicon LSI 12 is mounted on the fine electric interconnection.

In the combined substrate configured as described above, the control silicon LSI 12 controls the driver silicon LSI 10, which then drives the LD 8. The LD 8 is optically connected to the optical waveguide core 7.

The manufacturing process for the combined substrate illustrated in FIG. 1 will be described with reference to FIG. 2, which consists of cross sections illustrating a process for manufacturing the combined substrate of FIG. 1.

Figure 2A:
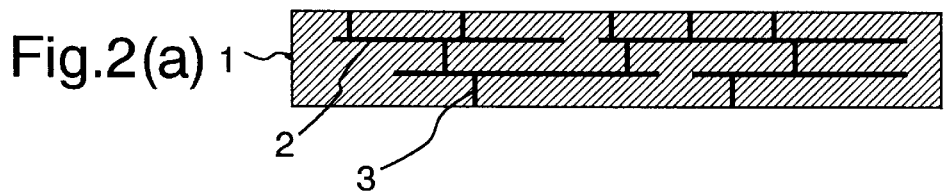
FIGS. 2(a) to (b) are cross sections illustrating a manufacturing process for the combined substrate of FIG. 1.

In the manufacturing process for the combined substrate, a ceramic multilayer interconnection substrate 1 is first formed as shown in FIG. 2(a).

Alumina powder, a flux, an organic binder, a solvent and a plasticizer are well mixed in a ball mill. The mixture is applied and extended on a carrier tape by a blade and dried to form a green sheet. Then, the green sheet is punched with a die, the hole is filled with a conductor paste made of a metal powder, and a given conductor pattern is printed on the green sheet. A plurality of green sheets prepared as described above are then piled and baked. A ceramic multilayer interconnection substrate 1 is thus prepared.

Figure 2B:
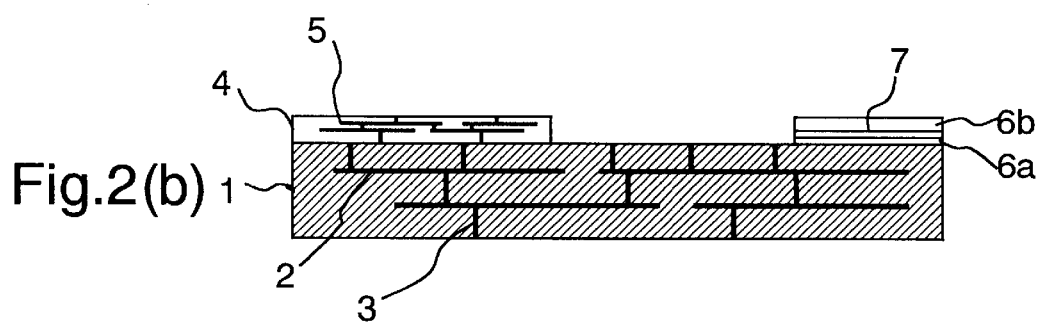

Then, as shown in FIG. 2(b), a fine electric interconnection part and an optical waveguide part are formed on the ceramic multilayer interconnection substrate 1.

On the ceramic multilayer interconnection substrate 1 is spin-coated a photosensitive resin which is to be a lower clad layer 6a in an optical waveguide and an electric insulating layer 4 in a fine electric interconnection. It is then exposed and developed to form a via pattern in an area to be used as the fine electric interconnection, to leave an area to be used as the lower clad layer 6a as an even resin film and to remove the photosensitive resin in an area where the surface of the ceramic multilayer interconnection substrate 1 is to be exposed. Herein, the photosensitive resin is a resin whose refractive index depends on an exposure dose, and in the exposure-development process the dose is adjusted such that the refractive index of the lower clad layer 6a is slightly lower than that of the optical waveguide core 7 described later. The photosensitive resin is then cured at a unique temperature for the resin. A plating resist is then applied by spin coating. It is then exposed and developed, and patterned for forming a fine copper interconnection. Copper plating is then applied to form a fine copper interconnection 5 and the plating resist is removed.

Subsequently, a photosensitive resin is spin-coated, which is to be an optical waveguide core layer 7 and an electric insulating layer 4 in a fine electric interconnection. It is exposed and developed to form a via pattern in an area to be used as a fine electric interconnection, to form a core pattern in an area to be used as an optical waveguide core 7, and to remove the photosensitive resin in an area where the surface of the ceramic multilayer interconnection substrate 1 is to be exposed. Herein, the photosensitive resin is a resin whose refractive index depends on an exposure dose, and in the exposure-development process, while patterning the optical waveguide core layer 7, the dose is adjusted such that the refractive index of the core layer 7 is slightly higher than that of the lower clad layer 6a. The photosensitive resin is then cured at a unique temperature for the resin. A plating resist is then applied by spin coating. It is then exposed and developed, and patterned for forming a fine copper interconnection. Copper plating is then applied to form a fine copper interconnection 5 and the plating resist is removed.

Subsequently, a photosensitive resin is spin-coated, which is to be an upper clad layer 6b in the optical waveguide clad layer 6 and an electric insulating layer 4 in a fine electric interconnection. It is exposed and developed to form a via pattern in an area to be used as a fine electric interconnection, to form a core pattern in an area to be used as an upper clad layer 6b, and to remove the photosensitive resin in an area where the surface of the ceramic multilayer interconnection substrate 1 is to be exposed. Herein, the photosensitive resin is a resin whose refractive index depends on an exposure dose, and in the exposure-development process, the dose is adjusted such that the refractive index of the upper clad layer 6b is slightly lower than that of the optical waveguide core layer 7. The photosensitive resin is then cured at a unique temperature for the resin. A plating resist is then applied by spin coating. It is then exposed and developed, and patterned for forming a fine copper interconnection. Copper plating is then applied to form a fine copper interconnection 5 and the plating resist is removed.

Figure 2C:
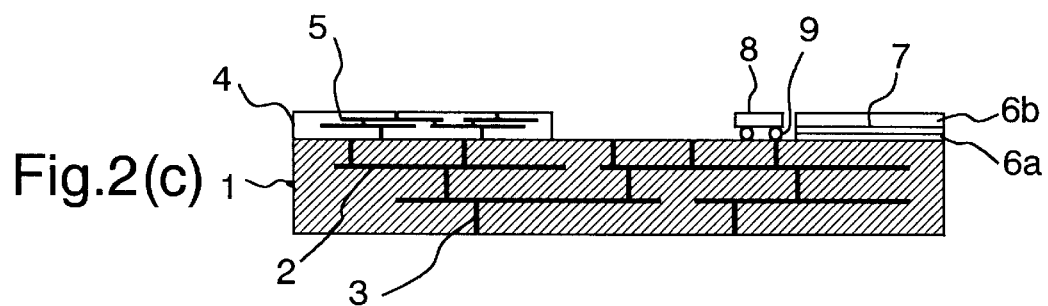

Then, as shown in FIG. 2(c), an LD 8 is mounted on the ceramic multilayer interconnection substrate 1 using a high-melting solder 9.

Figure 2D:
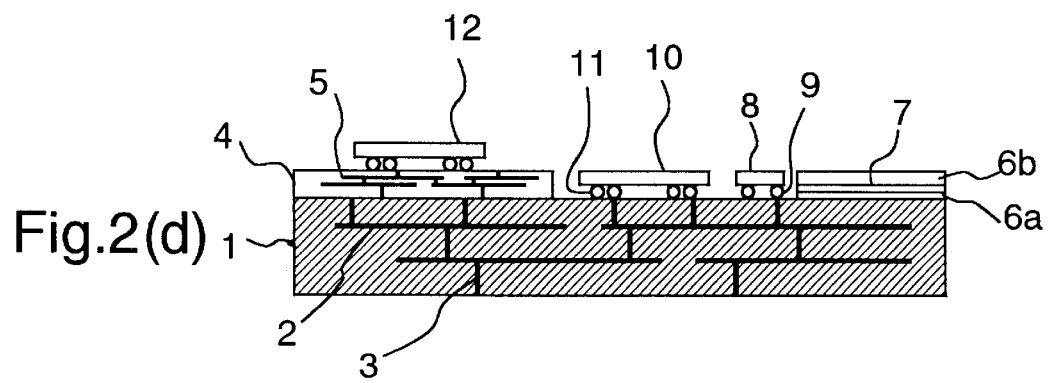

Finally, as shown in FIG. 2(d), a driver silicon LSI 10 is mounted on the ceramic multilayer interconnection substrate 1 via a solder bump 11 and a control silicon LSI 12 is mounted on the fine electric interconnection.

The above process can provide a combined substrate comprising a three-layered fine electric interconnection part consisting of an electric insulating layer 4 and a fine copper interconnection 5 and an optical waveguide part, in which an LD 8 and LSIs 10, 12 are mounted as an optical device and electric devices, respectively. According to the manufacturing process described above, the fine electric interconnection part and the optical waveguide part can be formed in separate areas, using the same material for the electric insulating layer 4 and the optical waveguide by the same process. The number of the interconnection layers in the fine electric interconnection part can be selected as appropriate. The optical waveguide is not limited to the above three-dimensional configuration.

Figure 3:
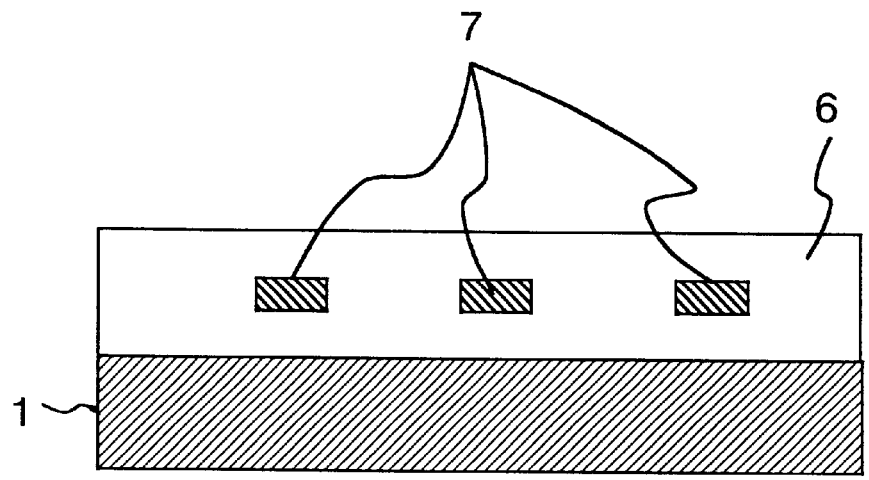
FIG. 3 is a side view of the optical waveguide in the combined substrate of FIG. 1.

FIG. 3 is a side view of the optical waveguide in the combined substrate of FIG. 1.

As seen in FIG. 3, an optical waveguide is formed in a configuration where an optical waveguide clad layer 6 surrounds the optical waveguide core layer 7. Although FIG. 3 shows an example comprising three optical waveguide core layers 7, the number of the core layers 7 may be varied, depending on, e.g., a desired application for an optical circuit.

(Embodiment 2)

Figure 4:
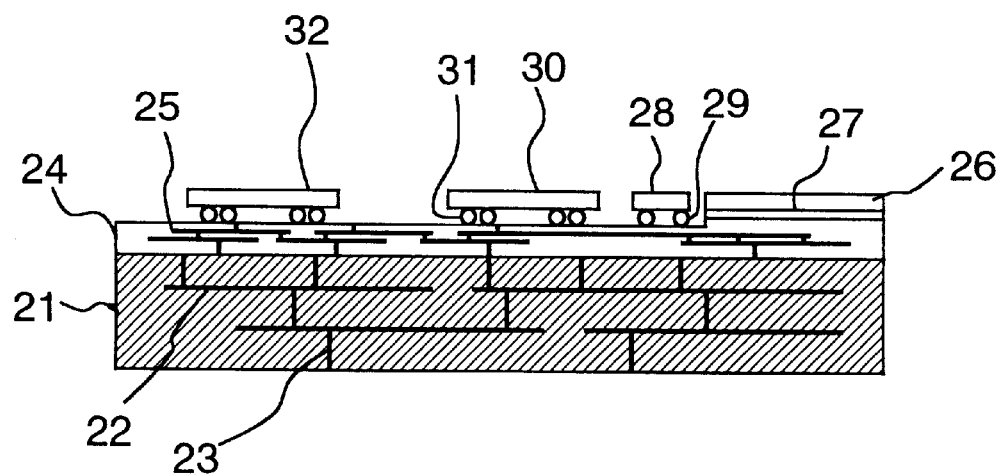
FIG. 4 is a cross section illustrating the second embodiment of the combined substrate according to the first aspect of this invention.

FIG. 4 is a cross section illustrating the second embodiment of a combined substrate according to the first aspect of this invention.

The combined substrate of this embodiment comprises a ceramic multilayer interconnection substrate 21 where an electric interconnection is formed on both surfaces and its inside via a copper interconnection 22 and an interlayer via hole 23. A fine electric interconnection layer consisting of an electric insulating layer 24 and a fine copper interconnection 25 is formed on the whole upper face of the interconnection substrate 21. Moreover, an optical waveguide part consisting of an optical waveguide core layer 27 and an optical waveguide clad 26 is formed in a given area on the fine electric interconnection layer. The electric insulating layer 24 and the optical waveguide part are made of the same material. On the fine electric interconnection layer are mounted an LD 28 via a high-melting solder bump 29 as well as a driver silicon LSI 30 and a control silicon LSI 32 via a solder bump 31.

In the combined substrate configured as described above, the control silicon LSI 32 controls the driver silicon LSI 30, which then drives the LD 28. The laser diode 28 is optically connected to the optical waveguide core 27.

The manufacturing process for the combined substrate illustrated in FIG. 4 will be described with reference to FIG. 5, which consists of cross sections illustrating a process for manufacturing the combined substrate of FIG. 4.

Figure 5A:
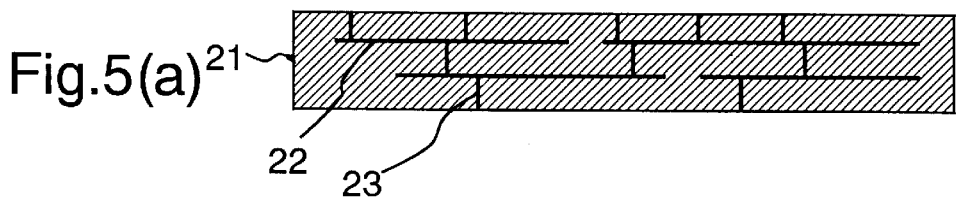
FIGS. 5(a) to (d) are cross sections illustrating a manufacturing process for the combined substrate of FIG. 4.

In the manufacturing process for the combined substrate, a ceramic multilayer interconnection substrate 21 is first formed as shown in FIG. 5(a).

Alumina powder, a flux, an organic binder, a solvent and a plasticizer are well mixed in a ball mill. The mixture is applied and extended on a carrier tape by a blade and dried to form a green sheet. Then, the green sheet is punched with a die, the hole is filled with a conductor paste made of a metal powder, and a given conductor pattern is printed on the green sheet. A plurality of green sheets prepared as described above are then piled and baked. A ceramic multilayer interconnection substrate 21 is thus prepared.

Figure 5B:
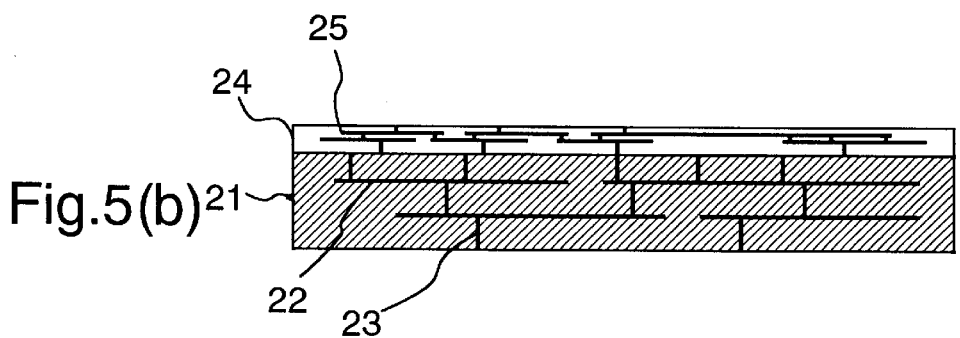

Then, as shown in FIG. 5(b), a fine electric interconnection part is formed on the whole upper surface of the ceramic multilayer interconnection substrate 21.

On the ceramic multilayer interconnection substrate 21 is spin-coated a photosensitive resin which is to be an electric insulating layer 24. It is then exposed and developed to form a pattern for an electric insulating layer, and heated at a unique temperature for the resin to be cured. A plating resist is applied by spin coating, and exposed and developed. After patterning for an electric conductor layer, copper plating is applied to form a fine copper interconnection 25.

The above steps of forming the electric insulating layer and of forming the fine copper interconnection are repeated by adequate times to form a desired fine electric interconnection layer on the ceramic multilayer interconnection substrate 21.

Figure 5C:
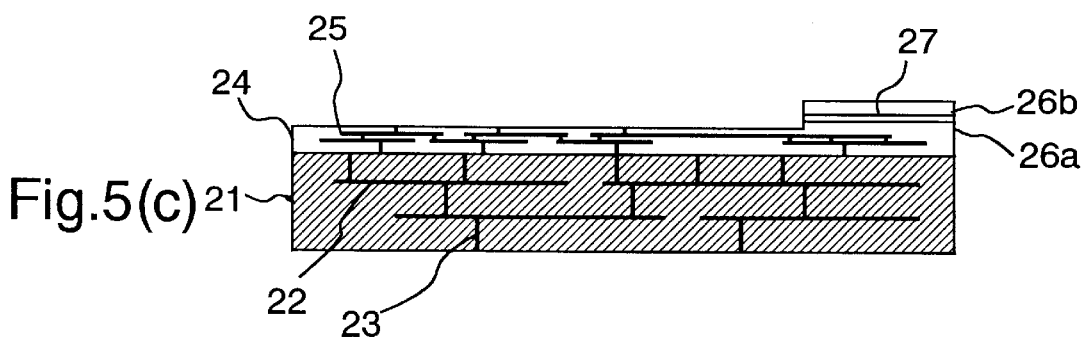

Subsequently, as shown in FIG. 5(c), an optical waveguide part is formed on the fine electric interconnection part consisting of the electric insulating layer 24 and the fine copper interconnection 25 on the ceramic multilayer interconnection substrate 21.

On the fine electric interconnection is first spin-coated the same resin as that for the electric insulating layer 24 to be a lower clad layer 26a in the optical waveguide. It is exposed and developed to pattern the optical waveguide lower clad layer 26a into a given shape. The resin is cured at a unique temperature for the resin. Then, the same resin as that for the electric insulating layer 24 to be an optical waveguide core layer 27 is spin-coated. It is then exposed and developed to pattern a given area into an optical waveguide core layer 27. The resin is cured at a unique temperature for the resin.

Subsequently, the same resin as that for the electric insulating layer 24 to be an optical waveguide upper clad layer 26b is spin-coated. It is then exposed and developed to pattern a given the upper clad layer 26b into a given shape. The resin is cured at a unique temperature for the resin. The clad layers 26a, 26b and the core layer 27 are made of a resin whose refractive index depends on an exposure dose. In the process of exposure and development, while patterning, the dose is adjusted such that the refractive index of the optical waveguide core layer 27 is slightly lower than that of the clad layer 26.

Figure 5D:
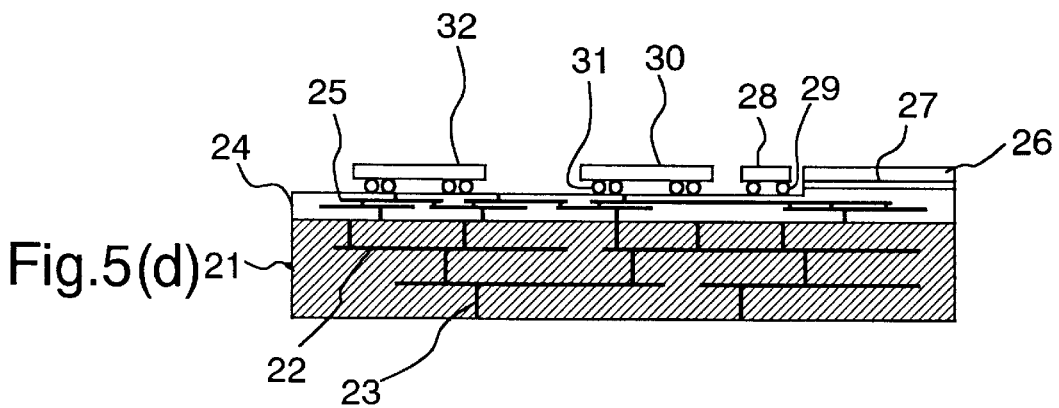

Finally, as shown in FIG. 5(d), an LD 28 is mounted on the fine electric interconnection part via a high-melting solder 29 while a driver silicon LSI 30 and a control silicon LSI 32 are mounted on the fine electric interconnection part via a solder bump 31.

The above process can provide the combined substrate of this embodiment. According to the manufacturing process described above, the optical waveguide part can be formed on the fine electric interconnection part of the ceramic multilayer interconnection substrate 21, using the same material for the electric insulating layer 24 and the optical waveguide by the same process. The number of the interconnection layers in the fine electric interconnection part can be selected as appropriate. The optical waveguide is not limited to the above three-dimensional configuration.

(Embodiment 3)

Figure 6:
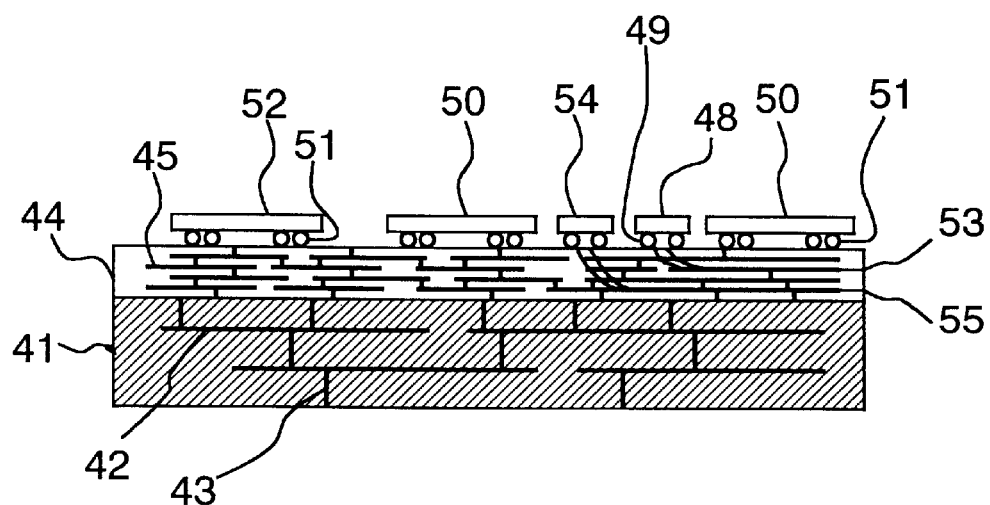
FIG. 6 is a cross section illustrating the third embodiment of the combined substrate according to the first aspect of this invention.

FIG. 6 is a cross section illustrating the third embodiment of a combined substrate according to the first aspect of this invention.

The combined substrate of this embodiment comprises a ceramic multilayer interconnection substrate 41 where an electric interconnection is formed on both surfaces and its inside via a copper interconnection 42 and an interlayer via hole 43. A fine electric interconnection layer consisting of an electric insulating layer 44 and a fine copper interconnection 45 is formed on the whole upper face of the interconnection substrate 41. Moreover, an optical waveguide consisting of an optical-transmitting core layer 53 and an optical-receiving core layer 55 is formed in the fine electric interconnection layer. The electric insulating layer 44 and the optical waveguide are made of the same material. On the fine electric interconnection layer are mounted an LD 48 via a high-melting solder bump 49 as well as a driver silicon LSI 50 and a control silicon LSI 52 via a solder bump 51.

In the combined substrate configured as described above, the control silicon LSI 52 controls the driver silicon LSI 50, which then drives the LD 48. The LD 48, the optical-transmitting core 53, the PD 54 and the optical-receiving core 55 are optically connected with each other.

The manufacturing process for the combined substrate illustrated in FIG. 6 will be described with reference to FIG. 7, which consists of cross sections illustrating a process for manufacturing the combined substrate of FIG. 6.

Figure 7A:
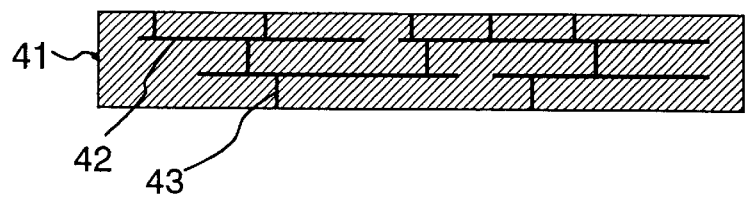
FIGS. 7(a) to (d) are cross sections illustrating a manufacturing process for the combined substrate of FIG. 6.

Alumina powder, a flux, an organic binder, a solvent and a plasticizer are well mixed in a ball mill. The mixture is applied and extended on a carrier tape by a blade and dried to form a green sheet. Then, the green sheet is punched with a die, the hole is filled with a conductor paste made of a metal powder, and a given conductor pattern is printed on the green sheet. A plurality of green sheets prepared as described above are then piled and baked. A ceramic multilayer interconnection substrate 41 is thus prepared as shown in FIG. 7(a).

Figure 7B:
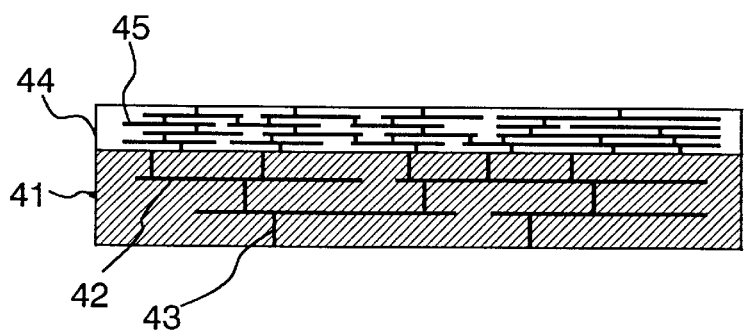

Then, as shown in FIG. 7(b), a fine electric interconnection part is formed on the whole upper surface of the ceramic multilayer interconnection substrate 41.

On the ceramic multilayer interconnection substrate 41 is spin-coated a photosensitive resin which is to be an electric insulating layer 44. It is then exposed and developed to form a pattern for an electric insulating layer, and heated at a unique temperature for the resin to be cured. A plating resist is applied by spin coating, and exposed and developed. After patterning for an electric conductor layer, copper plating is applied to form a fine copper interconnection 45.

The above steps of forming the electric insulating layer and of forming the fine copper interconnection are repeated by adequate times to form a desired fine electric interconnection layer on the ceramic multilayer interconnection substrate 41.

Figure 7C:
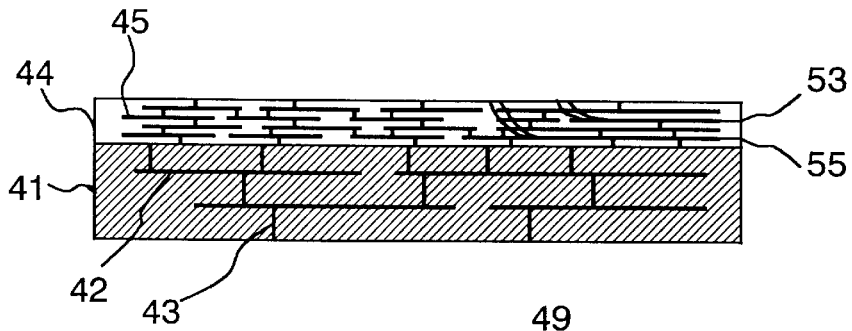

Subsequently, as shown in FIG. 7(c), an optical waveguide is formed in the electric insulating layer 44 of the fine electric interconnection on the ceramic multilayer interconnection substrate 41. The photosensitive resin is a resin whose refractive index depends on a dose of laser beam as an exposing light. The laser beam is scanned while focusing on areas where photosensitive-resin core layers 53, 55 are to be formed such that the refractive index of the optical waveguide core layers 53, 55 is slightly higher than that of the surrounding electric insulating layer 44, to three-dimensionally draw the optical waveguide core layers 53, 55.

Figure 7D:
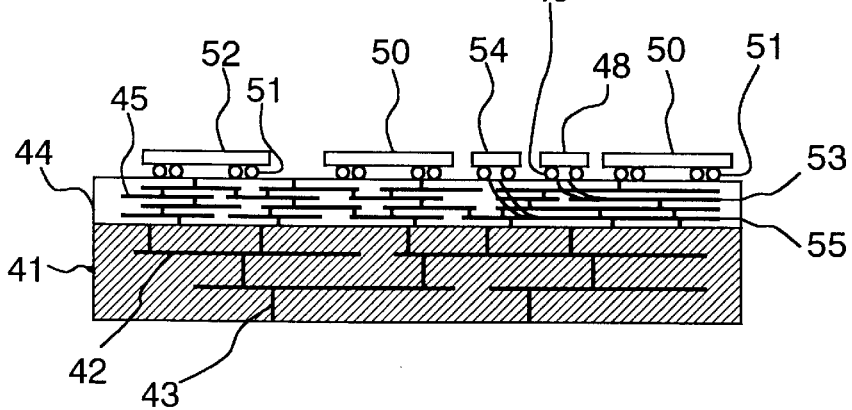

Finally, as shown in FIG. 7(d), an LD 48 is mounted on the fine electric interconnection part via a highmelting solder 49 while a driver silicon LSI 50 and a control silicon LSI 52 are mounted on the fine electric interconnection part via a solder bump 51.

The above process can provide the combined substrate of this embodiment. According to the manufacturing process described above, the optical waveguide can be formed on the fine electric interconnection of the ceramic multilayer interconnection substrate 41, using the same material for the electric insulating layer 44 and the optical waveguide by the same process.

The second aspect of this invention will be described.

Mounting an optical device, particularly a light emitting diode such as an LD, on a ceramic substrate while mounting an electric device on a resin filled in a concave on the ceramic substrate can more effectively prevent thermal interference between the electric and the optical devices than the case where an optical and an electric devices are mounted using only a ceramic substrate, because a resin has a lower thermal conductivity than a ceramic. In particular, when a fine electric interconnection is formed using a resin as an electric insulating layer, an electric device with a finer interconnection which cannot be achieved in a ceramic electric interconnection, can be mounted. Furthermore, the optical device is mounted on the ceramic substrate which is harder than a resin, and thus misalignment of an optical axis can be effectively prevented. Moreover, an electric and an optical devices can be mounted by an equivalent process such as bare-chip mounting. These devices can be, therefore, closely mounted to reduce the length of the electric interconnection between the devices, leading to further densification. Herein, it is desirable that the surfaces of the ceramic substrate on which an optical device is mounted and of the resin filled in the concave where an electric device is mounted are at the substantially same level to avoid difficulty in forming an electric interconnection.

The ceramic substrate may be a multilayer ceramic interconnection substrate prepared by molding into a desired shape ceramic powder such as alumina, aluminum nitride, silicon carbide and beryllium oxide, which is optionally combined with, e.g., a binder; forming an interconnection pattern on its surface to form a green sheet; and then piling a plurality of green sheets which are then baked. In addition, materials such as mullite ($3Al_2O_3 \cdot 2SiO_2$), glass ceramic, aluminum nitride, silicon carbide and beryllium oxide may be used alone.

The concave on the ceramic substrate may be formed by an appropriate process such as, but not limited to, piling a given number of green sheets which have been preliminary punched out the area to form the concave, depending on the depth of the concave; or applying a photoresist, exposing an area to be processed and sand-blasting the area.

A resin material filled in the concave on the ceramic substrate may be any resin which is commonly used for a usual electric device, preferably an epoxy or polyimide resin.

The resin may be filled by either applying the resin on the whole surface of the substrate including the concave by an application technique such as bar coating, knife coating and spin coating, or applying the resin only on the concave using a means such as a dispenser. The surfaces of the resin and of the ceramic can be at the same level by applying a suitable curing technique to the resin used and then grinding the surface for leveling. Alternatively, the resin may be separately cured into a shape corresponding to the concave on the ceramic substrate and it may be then adhered to the concave on the ceramic substrate. As used herein, the term "at the same level" should not be necessarily construed to indicate that these surfaces must provide a strictly even plane with no tiny steps. A small step may be acceptable as long as an interconnection between an optical and an electric device can be formed without disconnection.

(Embodiment 1)

Figure 8:
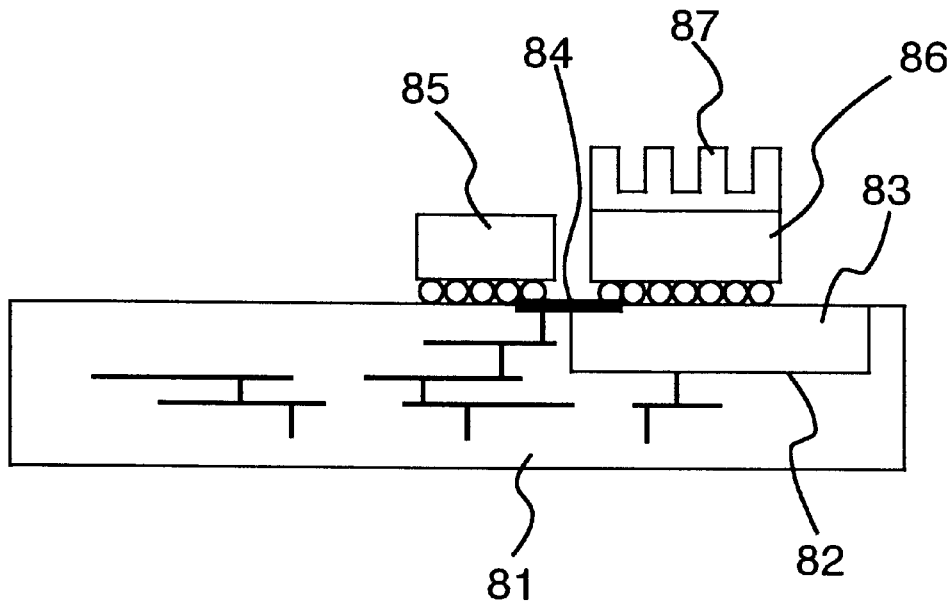
FIG. 8 shows the first embodiment of the second aspect according to this invention, where there is formed, on a concave in a ceramic multilayer interconnection substrate, a fine interconnection using a resin as an electric insulating layer, and an electric device is mounted on the interconnection while an optical device on the ceramic substrate.

FIG. 8 shows the first embodiment of the second aspect. A ceramic multilayer interconnection substrate 81 has a concave 82 filled with a resin 83. The surfaces of the ceramic multilayer interconnection substrate 81 and the resin 83 filled in the concave 82 are at the same level. An optical device 85 is mounted on the ceramic multilayer interconnection substrate 81 while an electric device 86 with a cooling fin 87 on the resin 83 filled in the concave 82 of the ceramic multilayer interconnection substrate 81. The optical and the electric devices are electrically connected via an electric interconnection 84 with the shortest distance.

(Embodiment 2)

Figure 9:
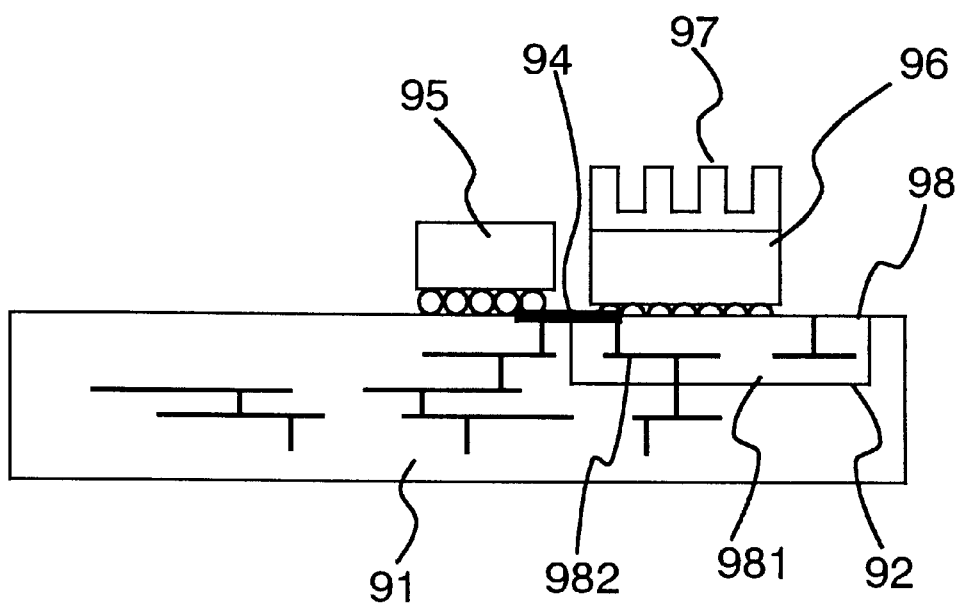
FIG. 9 shows the second embodiment of the second aspect according to this invention, where a resin is filled in a concave in a ceramic multilayer interconnection substrate, and an electric device is mounted on the resin while an optical device on the ceramic substrate.
Figure 10A:
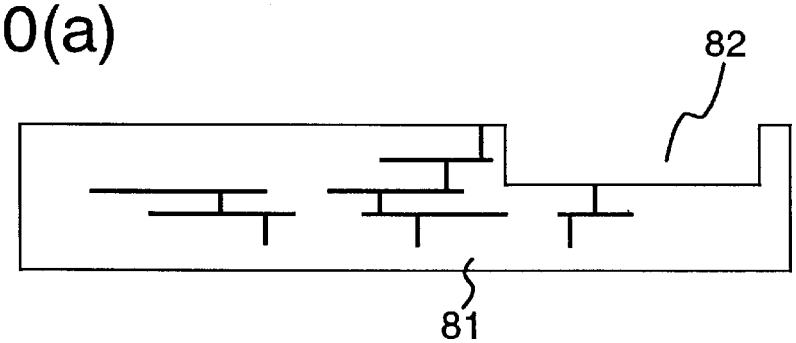
FIG. 10 illustrates a process for manufacturing the substrate of FIG. 8.
Figure 10B:
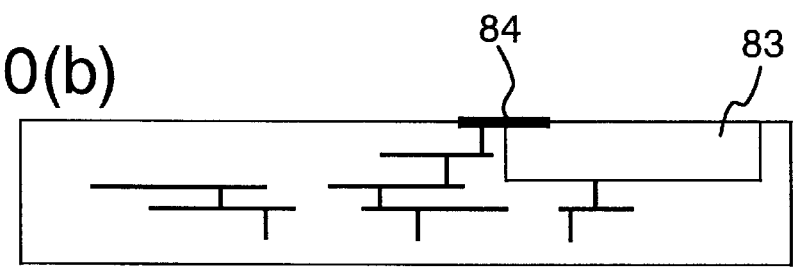
Figure 10C:
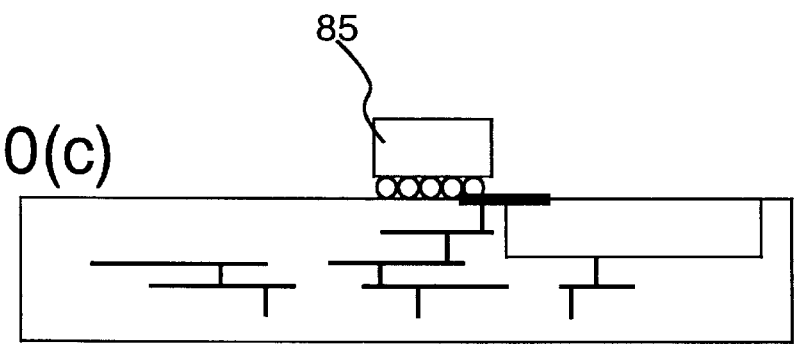
Figure 10D:
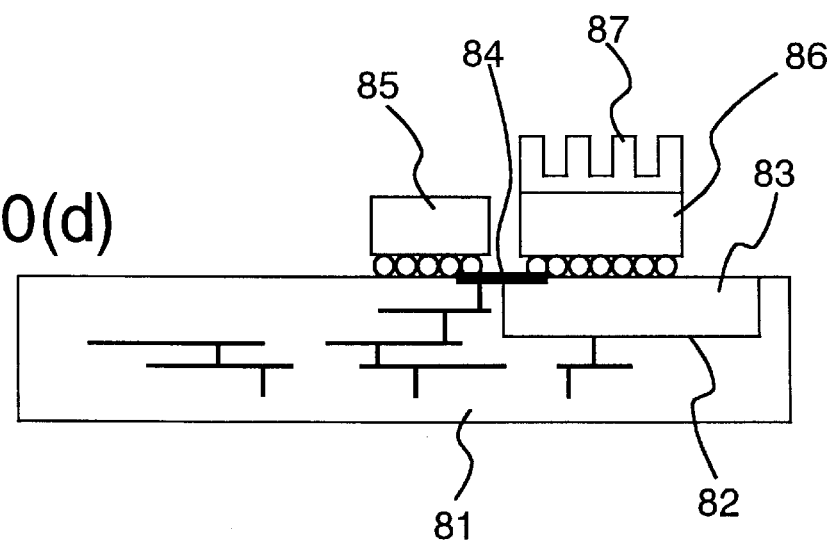
Figure 11A:
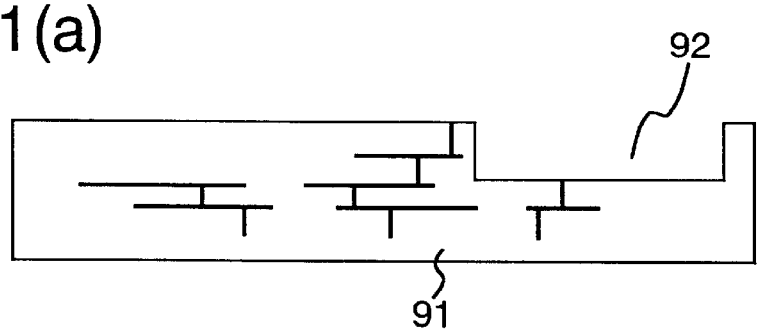
FIG. 11 illustrates a process for manufacturing the substrate of FIG. 9.
Figure 11B:
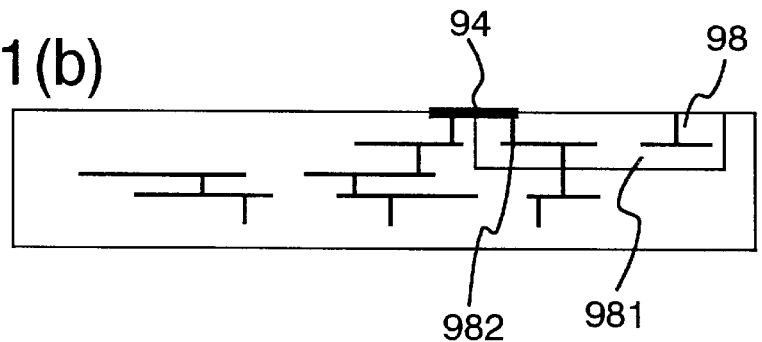
Figure 11C:
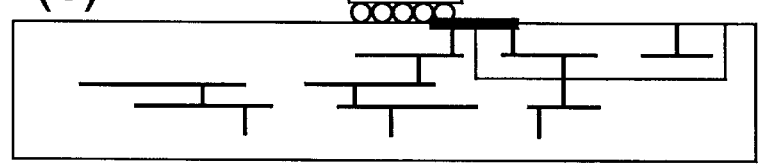
Figure 11D:
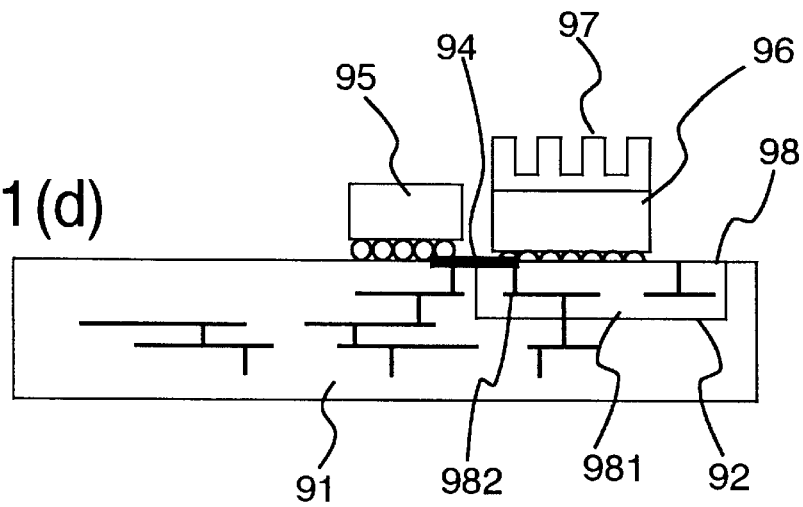

FIG. 9 shows the second embodiment of the second aspect. A ceramic multilayer interconnection substrate 91 has a concave 92 in which a fine electric interconnection layer 98 consisting of an electric insulating resin layer 981 and an electric conductor layer 982 is formed. The surfaces of the ceramic multilayer interconnection substrate 91 and the fine electric interconnection layer 98 in the concave 92 are at the same level. An optical device 95 is mounted on the ceramic multilayer interconnection substrate 91 while an electric device 96 with a cooling fin 97 on the fine electric interconnection layer 98 in the concave 92 of the ceramic multilayer interconnection substrate 91. The optical and the electric devices 95, 96 are electrically connected via an electric interconnection 94 with the shortest distance.

The third aspect of this invention will be described.

An optical waveguide according to the third aspect of this invention essentially consists of a core and a clad. There are no restrictions for its structure; it may be a built-in type or ridge type of optical waveguide.

A fluorene-unit-containing epoxy acrylate resin used in this invention comprises the fluorene unit represented by formula (3) and an epoxy acrylate (including an epoxy methacrylate) unit which is a UV-curable functional group.

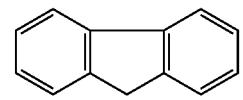

Such a resin is particularly used as a material for an optical waveguide because 1) it comprises both fluorene and epoxy acrylate units which allow the material to be deposited at a lower temperature while being heat resistant adequately to endure a photo-irradiation mounting process; 2) it exhibits a small light propagation loss at communication wavelengths of 1.3 and 1.55 μm so that it is very effective as a material for an optical waveguide; and 3) it allows the refractive indices of the core and the clad layers to be conveniently controlled only by changing an exposure dose, which is required during forming an optical waveguide.

A particularly preferable epoxy acrylate resin comprising a fluorene unit is a compound represented by formula (1):

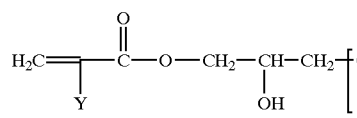

wherein X is the chemical structure represented by formula (2), Y is hydrogen or methyl, and n is an integer of 0 or more:

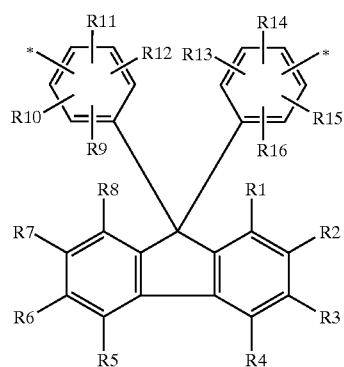

wherein *s in the benzene rings indicate bonding positions to the chemical structure X in formula (1), and the positions * may be independently selected from ortho-, meta- and para-positions to the bonding position of the fluorene unit with the benzene rings; R1 to R16 are independently selected from a hydrogen atom, an alkyl group, an alkoxy group, an alkoxycarbonyl group, an aryl group and an aralkyl group.

The substituents R1 to R16 are selected from the group consisting of $C_{1-8}$ alkyl group such as methyl, ethyl, propyl and butyl; $C_{1-8}$ alkoxy group such as methoxy, ethoxy, propoxy and butoxy; $C_{2-9}$ alkoxycarbonyl group such as methoxycarbonyl, ethoxycarbonyl, propoxycarbonyl and butoxycarbonyl; aryl group such as phenyl, tolyl, xylyl, mesylyl, cumenyl, naphthyl and anthracenyl; and aralkyl group such as benzyl, phenetyl, 1-phenylethyl, 1-methyl-1- phenylethyl and methylbenzyl. For the above substituents including a branched structure such as $C_4$ or more alkyl, their isomers are also encompassed within this invention.

A radical initiator may be added to the resin to promote photopolymerization. A radical initiator may be selected from, but not limited to, known peroxide initiators and azobis-type initiators. Peroxide initiators include methyl ethyl ketone peroxide, isobutyl peroxide and cumene hydroperoxide. Azobis-type initiators include 1,1'-azobiscyclohexane-1-carbonitrile and 4,4'-azobis(4-cyanovaleric acid).

A fluorene-unit-containing epoxy acrylate resin including these compositions is dissolved into a solvent, the resulting solution is applied to a given substrate to form a layer, and it is then subject to pre-heating for evaporating the solvent to provide a dried film.

The solvent can preferably homogeneously dissolve or otherwise homogeneously disperse the fluorene-unit-containing epoxy acrylate resin, and can be appropriately selected, taking into its boiling point consideration. For example, the resin may be dissolved or dispersed in an organic solvent such as cellosolves or a photopolymerizable compound which is liquid at an ambient temperature such as a lower molecular weight epoxy (meth)acrylate, as long as the properties of the optical waveguide such as heat resistance, a refractive index and an optical-propagation loss are not deteriorated.

The concentration of the fluorene-unit-containing epoxy acrylate resin in the solution or homogeneous dispersion may be appropriately selected, depending on, e.g., a designed film thickness.

A substrate to which the resin is applied may be, for example, a silicon, ceramic or printed substrate.

When the film is used as a core, a given core-shaped area is subject to UV curing by partial exposure using a mask, where the refractive index of the core depends on a UV dose. Furthermore, it is soaked in an amine-based alkaline developing solution for developing and etching the unexposed areas to form a core.

When the film is used as a clad layer, UV is irradiated with a dose more than a predetermined dose to a core area to adjust the refractive index of the clad to be lower than that of the core.

An exemplary relationship between a dose and a refractive index is shown in Table 1.

TABLE 1

| Dose (mJ/cm²) | Refractive index (measuring wavelength: 1.3 μm) |
| --- | --- |
| 0 | 1.57078 |
| 100 | 1.56782 |
| 800 | 1.56671 |

The data in Table 1 were determined as described below.

On a substrate was spin-coated a solution of a fluorene-unit-containing epoxy acrylate resin represented by formula (4) under the conditions of 800 rpm for 10 sec. and 4000 rpm for 30 sec. to give a film. After pre-drying at 75° C. for about 10 min., it was exposed and heated (post-baked) at 230° C. for about 30 min. under an atmosphere of nitrogen to give an even film with a thickness of 4.7 μm. Under three different conditions (dose: 0, 100 and 800 mJ/cm²), three samples were prepared and then determined for their refractive indices by a prism coupler technique.

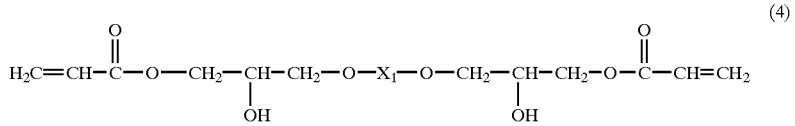

(4)

wherein the moiety $X_1$ is represented by formula (5) in which both attachment positions *s are at para positions to the fluorene unit.

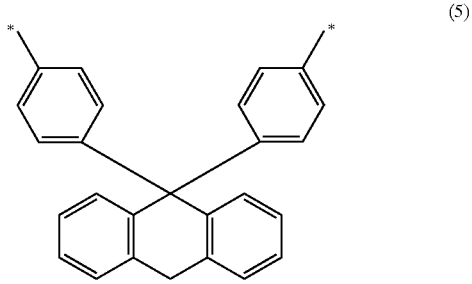

(5)

It is most preferable to adjust an UV dose for controlling a refractive index. Alternatively, the refractive index may be controlled by using different types of fluorene-unit-containing epoxy acrylate resin in the clad and the core layers or adjusting a mix ratio for a composition comprising the fluorene-unit-containing epoxy acrylate resin.

Thus, a core or both core and clad can be formed using a fluorene-unit-containing epoxy acrylate resin.

The resin may be of a higher crosslink density and higher heat resistance by post-baking (a post-heating process) at a temperature of 160 to 250° C., preferably 230 to 250° C. for about 30 to 90 min.

There are, for example, the following relationship between a glass-transition temperature of the compound represented by formula (4) and a post-baking temperature; when a post-baking temperature is 200, 210 or 230–250° C., a glass-transition temperature is generally 250, 260 or 300° C., respectively.

After the above post-baking process, the refractive index of a fluorene-unit-containing epoxy acrylate resin is fixed at a certain value. Therefore, when forming each layer of an optical waveguide using a fluorene-unit-containing epoxy acrylate resin, the layer is preferably post-baked before forming a subsequent layer. Thus, post-baking after forming each layer can prevent fluctuation in a refractive index during subsequent UV irradiation or heating.

This invention will be specifically described with reference to non-limiting examples.

EXAMPLE 1

A material with which fine processing can be performed with a high optical transparency and a low cost, is required for preparing a combined substrate according to the first embodiment of this invention. For example, a fluorene-unitcontaining epoxy acrylate resin (V259PA, NIPPON STEEL CHEMICAL CO., LTD.) meets these conditions, i.e., its optical loss as a single-mode optical waveguide is about 0.3 dB/cm, which is comparable to other polymer materials developed for an optical waveguide. The above epoxy acrylate resin is UV sensitive and has an adequate resolution for miniaturization, so that a several-micron level of electric interconnection can be formed with a low cost.

There will be described a process for manufacturing an optical waveguide using a fluorene-unit-containing epoxy acrylate resin.

On a substrate in which an optical waveguide is to be formed is applied a coating solution of a fluorene-unit-containing epoxy acrylate resin by a common technique such as spin coating and dip coating to give an applied film. It is then baked for evaporating the solvent and then exposed to adjust the refractive index of a lower clad to an appropriate value. Then, it is heated (post-baked) at 160 to 250° C. for about 30 to 90 min. to solidify the exposed area to form a lower clad. On the lower clad is applied a coating solution of a fluorene-unit-containing epoxy acrylate resin by a common technique such as spin coating and dip coating to give an applied film. It is baked for evaporating the solvent and then exposed through a patterned glass mask to adjust the refractive index of a core while curing a desired area. The refractive index of the core must be lower by up to 1% than that of the surrounding clad.

The above substrate is soaked in a potassium hydroxide solution or an amine-based alkaline developing solution for dissolving the unexposed area and developing. It is then heated (post-baked) at 160 to 250° C. for about 30 to 90 min. to solidify the exposed area to shape an optical waveguide core. Subsequently, on the core and the lower clad is deposited a fluorene-unit-containing epoxy acrylate resin as an upper clad as described for the lower clad. Thus, the above process can conveniently provide a heat-resistant single-mode optical waveguide having a core-section height and width of about several micrometers or a multi-mode optical waveguide having a core-section height and width of about several ten micrometers.

In another example, e.g., in a combined substrate illustrated in FIG. 1, a material having a high thermal conductivity such as aluminum nitride, silicon carbide and beryllium oxide may be used as a ceramic material for a ceramic multilayer interconnection substrate 1 for effectively releasing heat from an LD 8.

In another example, e.g., in a combined substrate illustrated in FIG. 1, a material whose coefficient of thermal expansion is substantially equal to that of the LD 8 material may be used as a ceramic material for the ceramic multilayer interconnection substrate 1 for minimizing distortion in the LD 8 due to a difference in a thermal expansion between the LD 8 and the ceramic multilayer interconnection substrate 1 caused by temperature variation during die bonding of the LD 8.

In the above embodiments and examples, there is illustrated a case where an electric interconnection part and an optical waveguide part are mounted on a ceramic multilayer interconnection substrate, but it is not always necessary in a photo-electric combined substrate according to the first aspect of this invention that an electric interconnection part and an optical waveguide part are mounted on the substrate. Furthermore, in a configuration where an electric interconnection part and an optical waveguide part are mounted on a substrate, the substrate may be, besides a ceramic multilayer interconnection substrate, an appropriately-configured substrate such as a simple ceramic substrate and a single-layer interconnection substrate on which an electric interconnection part and an optical waveguide part are mounted.

This invention should not be limited to the above embodiments or examples. Various changes or modifications can be allowed without departing from the scope of this invention.

An example of the second aspect of this invention will be described.

EXAMPLE 2

The structure illustrated in FIG. 8 is prepared by a process shown in FIG. 10. In step (a), a ceramic multilayer interconnection substrate 81 is prepared. Alumina powder, a flux, an organic binder, a solvent and a plasticizer are well mixed in a ball mill. The mixture is applied and extended on a carrier tape by a blade and dried to form a green sheet. Then, the green sheet is punched with a die, the hole is filled with a conductor paste made of a metal powder, and a given conductor pattern is printed on the green sheet. A plurality of green sheets thus prepared are then piled and baked to provide a ceramic multilayer interconnection substrate 81. A concave is formed by punching a required number of green sheets with a die.

In step (b), a resin 83 is filled in the concave 82 of the ceramic multilayer interconnection substrate 81. After spin-coating the resin 83, the resin 83 is heated at a unique temperature for the resin to be cured. The resin applied the areas other than the concave is ground to make the surfaces of the resin 83 of the concave and of the ceramic multilayer interconnection substrate 81 at the same level. Herein, the resin used was a polyimide. A solution of a precursor polyamic acid in N-methylpyrrolidone was applied the surface of the substrate 81 including the concave 82 by spin coating, it was heated at 350° C. to be cured into a polyimide, and it was ground with a grindstone until the ceramic substrate was completely exposed to build the resin in the concave. Then, a resist is applied on the whole surface of the ceramic substrate including the resin 83 filled in the concave 82, exposed and developed, patterned for forming an electric interconnection 84 between an electric device 86 and an optical device 85 and an electric interconnection for the electric device 86. Copper is plated. Then, on the ceramic multilayer interconnection substrate 81 and the resin surface in the concave 82 are formed electric interconnections 84 between an electric device 86 mounted on the resin and an optical device 85 mounted on the ceramic substrate 81 as well as between the ceramic multilayer interconnection substrate 81 and the electric device 86.

Figure 12A:
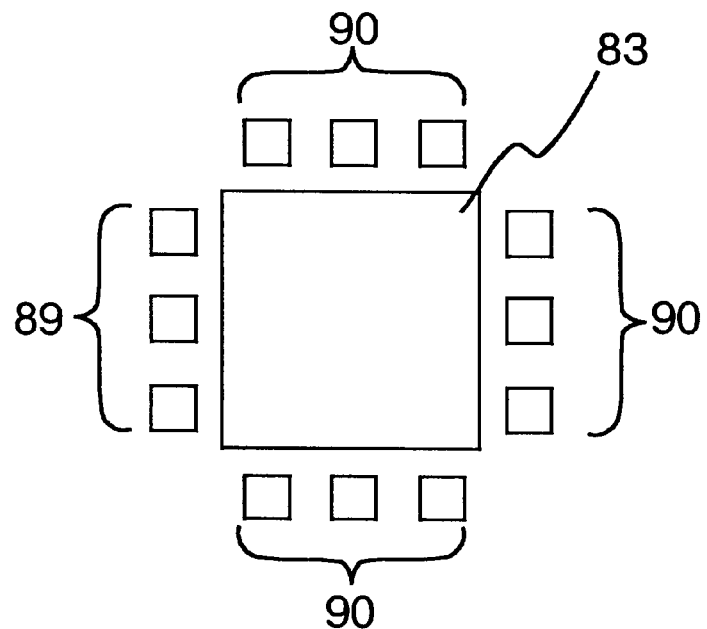
FIG. 12 is a plan view of a ceramic multilayer interconnection substrate for illustrating Step (b) in Example 2 in detail.
Figure 12B:
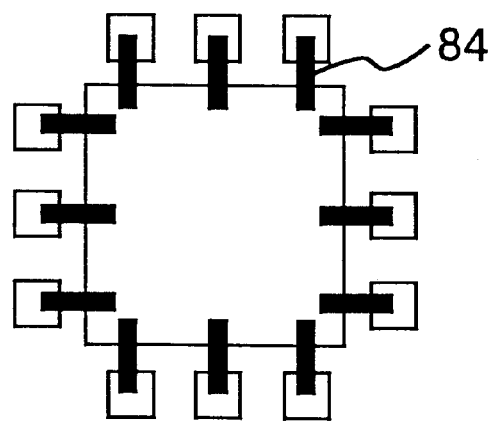

FIG. 12 is a plan view of the ceramic multilayer interconnection substrate illustrating forming the electric interconnection 84 in step (b). In FIG. 12(a), there are formed an electrode 89 for mounting the optical device 85 and an electrode 90 for the electric device around the resin 83 in the concave 82 on the ceramic multilayer interconnection substrate 81. The structure of FIG. 12(a) is subject to the process of step (b) in FIG. 10 to form the electric interconnection 84 from the electrode on the ceramic multilayer interconnection substrate 81 to the surface of the resin 83 in the concave 82 (FIG. 12(b)).

In step (c), the optical device (a light emitting diode) 85 is mounted on the ceramic substrate 81 using, e.g., a gold-tin solder ball. In step (d), the electric device 86 is mounted on the electric interconnection formed on the surface of the resin 83 filled in the concave 82 in the ceramic substrate 81 using, e.g., a gold-tin solder ball, and a cooling fin 87 is attached. Thus, the structure illustrated in FIG. 8 can be prepared.

EXAMPLE 3

The structure illustrated in FIG. 9 is prepared by a process shown in FIG. 11. In step (a), a ceramic multilayer interconnection substrate 91 is prepared. Alumina powder, a flux, an organic binder, a solvent and a plasticizer are well mixed in a ball mill. The mixture is applied and extended on a carrier tape by a blade and dried to form a green sheet. Then, the green sheet is punched with a die, the hole is filled with a conductor paste made of a metal powder, and a given conductor pattern is printed on the green sheet. A plurality of green sheets thus prepared are then piled and baked to provide a ceramic multilayer interconnection substrate 91. A concave is formed by punching a required number of green sheets with a die.

In step (b), a fine electric interconnection layer 98 is formed on the concave 92 in the ceramic multilayer interconnection substrate 91. A solution of photosensitive polyamic acid in N-methylpyrrolidone for electric insulation was applied by spin coating to the whole surface of the ceramic multilayer interconnection substrate 91 including the concave 92. The photosensitive polyamic acid solution applied to the concave as an electric insulating layer 981 is applied to the area lower than the ceramic surface. The applied solution is, therefore, exposed to a dose of about 500 mJ/cm$^2$ at a wavelength of 365 nm using, e.g., a stepper. It is developed to remove the resin applied on the areas other than the concave 92 while forming a pattern for an electric insulating layer on the resin layer formed in the concave 92. Then, it is heated at 350° C. under an atmosphere of nitrogen to cure the photosensitive polyamic acid into a polyimide. While forming the polyimide film in the concave 92, a polyimide film 981 is deposited on the side of the concave 92. In the light of the fact, the polyimide film other than the area around the side of the concave whose film thickness is constant is used as an insulating film for an electric interconnection. Since around the side in the concave 92 the polyimide is deposited to a level higher than the ceramic surface, the polyimide is ground with a grindstone to level the ceramic substrate and the surface. Subsequently, a plating resist is applied using an appropriate means such as a spin coater and a spray type of applicator, exposed and developed, patterned the electric conductor layer. Copper is plated to form an electric conductor layer 982. The above steps of forming the electric insulating layer and of forming the electric conductor layer are repeated by required times to form a desired fine electric interconnection layer 98 in the concave 92 of the ceramic multilayer interconnection substrate 91. A fine electric interconnection layer 98 is formed on the concave to the level of the ceramic substrate. Then, a resist is applied to the whole surface of the ceramic substrate including the fine electric interconnection layer 98 in the concave 92, exposed and developed, patterned for forming an electric interconnection between an electric and an optical devices. Copper is plated to form an electric interconnection between an electric device mounted on the fine electric interconnection 98 and an optical device 95 mounted on the ceramic substrate on the substrate surface.

Figure 13A:
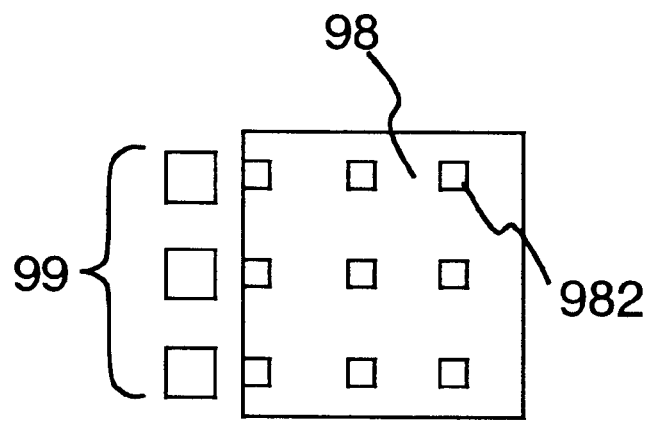
FIG. 13 is a plan view of a ceramic multilayer interconnection substrate for illustrating Step (b) in Examples 3 or 4 in detail.
Figure 13A:
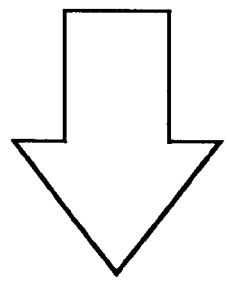
Figure 13B:
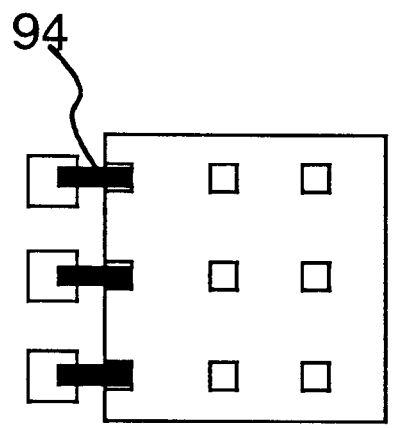

FIG. 13 is a plan view of the ceramic multilayer interconnection substrate 91 illustrating forming the electric interconnection 94 in step (b). In FIG. 13(a), there are formed an electrode 99 for mounting the optical device 95 in the vicinity of the fine electric interconnection layer 98 in the concave 92 on the ceramic multilayer interconnection substrate 91. The structure of FIG. 13(a) is subject to the process of step (b) in FIG. 11 to form the electric interconnection 94 from the electrode 99 on the ceramic multilayer interconnection substrate 91 to the electric conductor layer 982 in the concave 92 (FIG. 13(b)).

In step (c), the optical device (a light emitting diode) 95 is mounted on the ceramic substrate using, e.g., a gold-tin solder ball. In step (d), the electric device 96 is mounted on the electric interconnection formed on the fine electric interconnection layer formed in the concave of the ceramic substrate, and a cooling fin 97 is attached. Thus, the structure illustrated in FIG. 9 can be prepared.

EXAMPLE 4

The structure illustrated in FIG. 9 is prepared by a process shown in FIG. 11. In step (a), a ceramic multilayer interconnection substrate 91 is prepared. Alumina powder, a flux, an organic binder, a solvent and a plasticizer are well mixed in a ball mill. The mixture is applied and extended on a carrier tape by a blade and dried to form a green sheet. Then, the green sheet is punched with a die, the hole is filled with a conductor paste made of a metal powder, and a given conductor pattern is printed on the green sheet. A plurality of green sheets thus prepared are then piled and baked to provide a ceramic multilayer interconnection substrate 91. A concave is formed by punching a required number of green sheets with a die.

In step (b), a fine electric interconnection layer 98 is formed on the concave 92 in the ceramic multilayer interconnection substrate 91. A solution of polyamic acid in N-methylpyrrolidone for electric insulation was applied by spin coating to the whole surface of the ceramic multilayer interconnection substrate 91 including the concave 92. Then, it is heated at 350° C. under an atmosphere of nitrogen to cure the polyamic acid into a polyimide. While forming the polyimide film in the concave 92, a polyimide film 981 is deposited on the side of the concave 92. In the light of the fact, the polyimide film 981 other than the area around the side of the concave whose film thickness is constant is used as an insulating film for an electric interconnection. The polyimide film 981 is irradiated with a laser to form a via hole to form an insulating pattern. Subsequently, a plating resist is applied using an appropriate means such as a spin coater and a spray type of applicator, exposed and developed, patterned the electric conductor layer. Copper plating is applied to form an electric conductor layer 982. The above steps of forming the electric insulating layer and of forming the electric conductor layer are repeated by required times to form a desired fine electric interconnection layer 98 in the concave 92 of the ceramic multilayer interconnection substrate 91. The resin deposited on the areas other than the concave is removed by grinding with a grindstone. A fine electric interconnection layer 98 is formed on the concave to the level of the ceramic substrate. Then, a resist is applied to the whole surface of the ceramic substrate including the fine electric interconnection layer in the concave, exposed and developed, patterned for forming an electric interconnection between an electric and an optical devices. Copper plating is applied to form an electric interconnection between an electric device mounted on the fine electric interconnection 98 and an optical device 95 mounted on the ceramic substrate on the substrate surface.

Subsequently, as described in Example 3, the structure of FIG. 13(a) is subject to the process of step (b) in FIG. 11 to form the electric interconnection 94 from the electrode 99 on the ceramic multilayer interconnection substrate 91 to the electric conductor layer 982 in the concave 92 as illustrated in FIG. 13(b).

In step (c), the optical device (a light emitting diode) 95 is mounted on the ceramic substrate using, e.g., a gold-tin solder ball. In step (d), the electric device 96 is mounted on the electric interconnection formed on the fine electric interconnection layer formed in the concave of the ceramic substrate, and a cooling fin 97 is attached. Thus, the structure illustrated in FIG. 9 can be prepared.

EXAMPLE 5

In this example, a substrate is prepared as described in Example 2 except modification only in step (b). Specifically, a resin 83 to be filled in a concave is formed not directly on the ceramic multilayer interconnection substrate 81, but on a separate substrate by spin coating and heating. Then, the resin 83 to be filled is cut into pieces with the size of the concave 82 in the ceramic multilayer interconnection substrate 81 and released from the separate substrate. Alternatively, a photosensitive resin may be exposed and developed to provide pieces having the size of the concave 82, and then released from the separate substrate. The resin 83 thus obtained is adhered to the concave 82 in the ceramic multilayer interconnection substrate 81. Adhesives which may be used include epoxy, polyimide and silicone adhesions.

EXAMPLE 6

Figure 14:
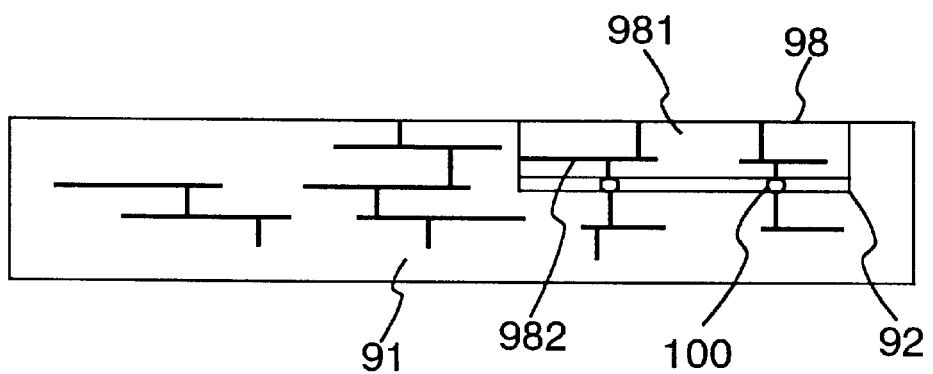
FIG. 14 is a structure in Example 5.

In this example, a substrate is prepared as described in Examples 3 and 4 except modification only in step (b). Specifically, a fine electric interconnection layer 98 is formed not directly on the ceramic multilayer interconnection substrate 91 having a concave 92, but on a separate substrate as described in the procedure for forming the fine electric interconnection layer 98 in Examples 3 and 4. Then, the fine electric interconnection layer 98 is cut into the pieces with the size of the concave 92 in the ceramic multilayer interconnection substrate 91 and released from the separate substrate. As illustrated in FIG. 14, the ceramic multilayer interconnection substrate is electrically connected to the fine electric interconnection layer 98 via a solder 100 in the concave 92 of the ceramic multilayer interconnection substrate 91.

EXAMPLE 7

In the structure illustrated in FIG. 8 or 9, a material having a high thermal conductivity such as aluminum nitride, silicon carbide and beryllium oxide is used as a ceramic material for a ceramic multilayer interconnection substrate 81 (91) for effectively releasing heat from an optical device 85 (95).

EXAMPLE 8

In the structure illustrated in FIG. 8 or 9, a material whose coefficient of thermal expansion is substantially equal to that of the optical device 85 (95) material is used as a ceramic material for the ceramic multilayer interconnection substrate 81 (91) for minimizing distortion in the optical device due to a difference in a thermal expansion between the optical device 85 (95) and the ceramic multilayer interconnection substrate 81 (91) caused by temperature variation during die bonding of the optical device 85 (95). Herein, the ceramic material was aluminum nitride (coefficient of thermal expansion: $4.6 \times 10^{-6}$ (1/K)) while the optical device was a GaAs laser diode (coefficient of thermal expansion: $4.7 \times 10^{-6}$ (1/K)).

The number of the concaves in the ceramic multilayer interconnection substrate may be selected as necessary. Any alternative may be selected for the ceramic material, a manufacturing process for the ceramic multilayer interconnection substrate, a manufacturing process for the high-density multiple interconnection layer in the concave, a procedure for filling the resin into the concave or a method for mounting the electric or optical device. This invention should not be construed to be limited to the above examples, and various alterations and modifications can be allowed without any deviation from the scope of this invention.

Examples of the third aspect of this invention will be described.

EXAMPLE 9

Figure 15:
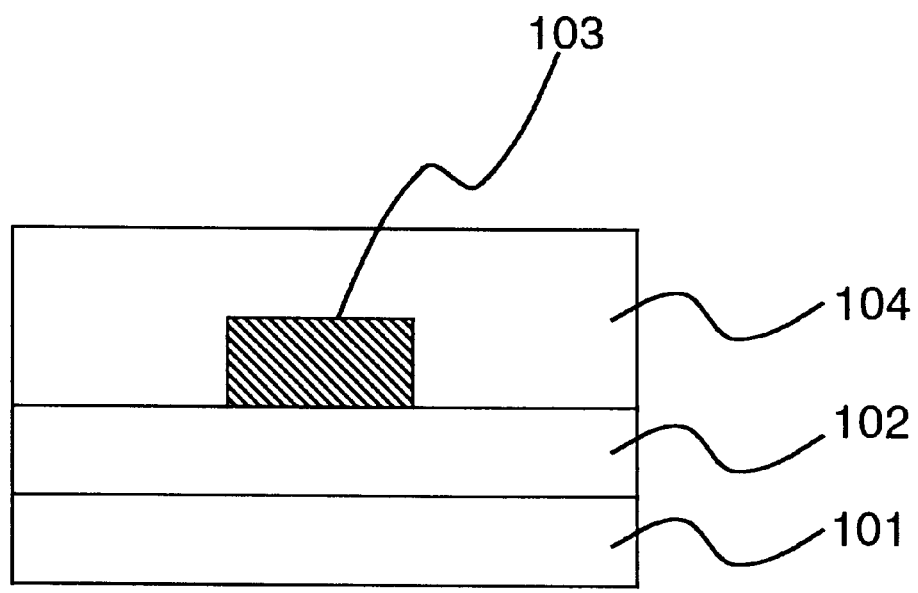
FIG. 15 is a schematic cross section of a built-in optical waveguide as an embodiment of the third aspect according to this invention.
Figure 16A:
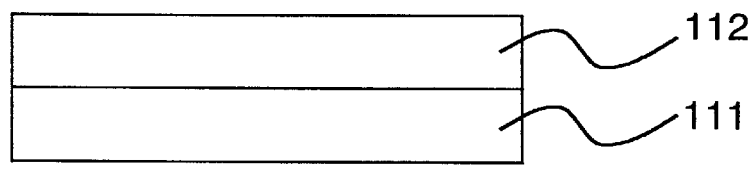
FIG. 16 is a schematic cross section of a built-in optical waveguide as another embodiment of the third aspect according to this invention.
Figure 16B:
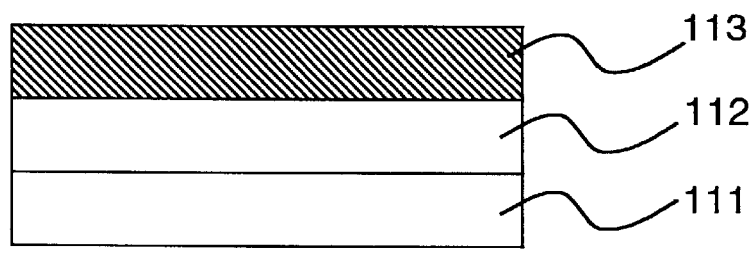
Figure 16C:
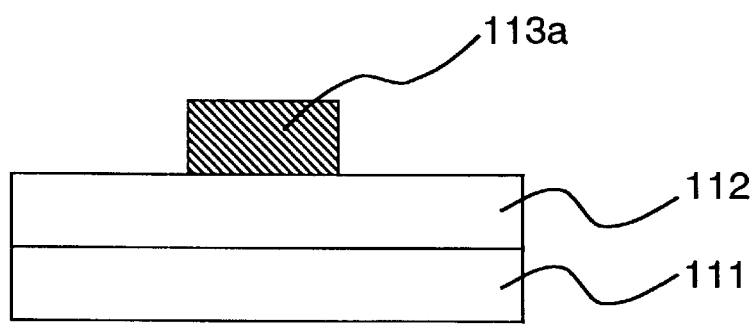
Figure 16D:
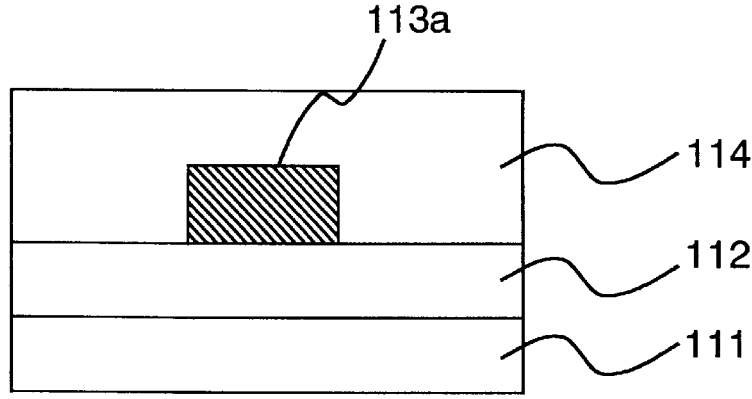

FIG. 15 is a schematic cross section of a built-in type of optical waveguide as an embodiment of this invention.

On a substrate 101 were sequentially deposited a lower clad layer 102 and a core 103. On the lower clad 102 was an upper clad covering the core 103. It is necessary that the upper and the lower clads have herein a lower refractive index than the core.

The lower and the upper clads 102, 104 were, in this example, made of a fluorinated polyimide with a refractive index of 1.560.

The optical waveguide illustrated in this figure was prepared as shown in FIG. 16.

In step (a), a fluorinated polyimide was deposited as a lower clad 122 on a substrate 121.

In step (b), on the lower clad 122 was spin-coated or dip-coated a coating solution of a fluorene-unit-containing epoxy acrylate resin to form an applied film. The film was subject to pre-heating at 75° C. for about 10 min. Then, the solvent was evaporated to form a core layer (a layer of the fluorene-unit-containing epoxy acrylate resin) 123.

The fluorene-unit-containing epoxy acrylate resin was a resin represented by formula (4), wherein the moiety $X_1$ is represented by formula (5) in which both attachment positions *s are at para positions to the fluorene unit.

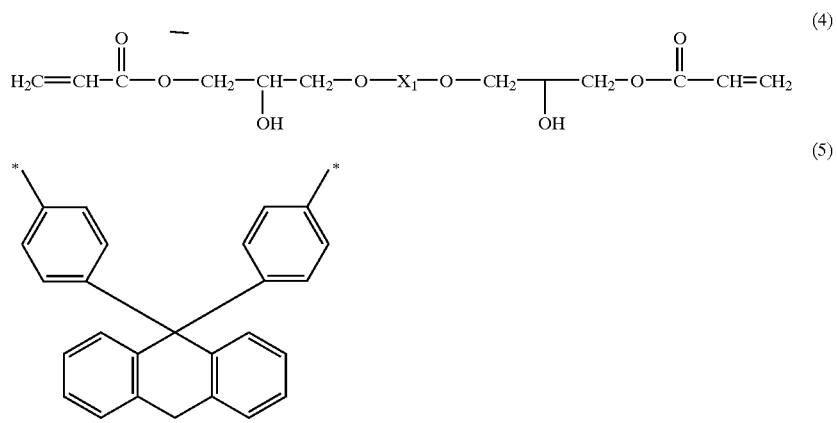

In step (c), the product was exposed through a glass mask having a given pattern at an exposure wavelength of 365 nm and an exposure dose of 300 mJ/cm$^2$.

Then, it was soaked in a potassium hydroxide solution or an amine-based alkaline developing solution for dissolving the unexposed area and developing. It is then heated (post-baked) at 230° C. for about 30 min to solidify the exposed area to shape an optical waveguide core 123a. The above process can provide a single-mode optical waveguide having a core-section height and width of about several micrometers or a multi-mode optical waveguide having a core-section height and width of about several ten micrometers.

After the post-curing, the core had a glass-transition temperature of 300° C. and a refractive index of 1.567. A glass-transition temperature of 300° C. or higher may provide adequate heat resistance to a mounting process for an optical device. As described above, heating at an elevated temperature of 230° C. or higher can provide a glass-transition temperature of 300° C. or higher.

In step (d), a fluorinated polyimide as an upper clad 124 was deposited on the lower clad 122, covering the core 123a, to give an optical waveguide.

The optical waveguide was determined for its optical propagation loss at a wavelength of 1.3 and 1.55 μm, exhibiting a good result of 0.3 dB/cm.

An optical propagation loss was determined as follows. A laser beam was introduced from one side of the optical waveguide using an optical fiber and propagated in the optical waveguide. The beams at the inlet and from the outlet were introduced into a photodetector using an optical fiber to determine light quantities. For a cut optical waveguide, similar measurement was conducted to determine an optical propagation loss from the relationship between the length of the optical waveguide and a light quantity from a photodetector.

In this example, a fluorinated polyimide as a core material was not used. A reactive ion etching can be, therefore, eliminated for forming a core, allowing an optical waveguide with high heat resistance to be prepared by a convenient process.

EXAMPLE 10

In this example, there will be described with reference to FIG. 16, an optical waveguide having the same structure as that illustrated in FIG. 15 for Example 9, where a fluorene-unit-containing epoxy acrylate resin is used for all of a core, a lower clad and an upper clad layers.

The fluorene-unit-containing epoxy acrylate resin was the resin represented by formula (4) in Example 9.

In step (a), on a substrate 121 was spin-coated or dip-coated a coating solution of a fluorene-unit-containing epoxy acrylate resin to form an applied film. The film was subject to pre-heating at 75° C. for about 10 min. Then, the solvent was evaporated to form a lower clad layer (a layer of the fluorene-unit-containing epoxy acrylate resin) 122.

Then, the product was exposed with a dose of 800 mJ/cm$^2$ to adjust the refractive index of the lower clad 122 to 1.5667.

The exposed area was cured and the refractive index was fixed by heating (post-baking) under an atmosphere of nitrogen at 230° C. for about 30 min.

In step (b), a core layer (a layer of the fluorene-unit-containing epoxy acrylate resin) 123 was formed on the lower clad 122 as described in Example 9 except changing a dose to 100 mJ/cm$^2$. The refractive index was 1.5678.

In step (c), an optical waveguide core 123a was formed as described in Example 9.

In step (d), on the lower clad 122 was formed a fluorene-unit-containing epoxy acrylate resin layer covering the core 123a, and it was exposed with a dose of 800 mJ/cm$^2$ to adjust the refractive index of the upper clad 124 to 1.5667. It was then post-baked under an atmosphere of nitrogen at 230° C. for 30 min to provide an optical waveguide.

The glass-transition temperature of the core and the clad was 300° C.

The optical waveguide was determined for its optical propagation loss at a wavelength of 1.3 and 1.55 μm, exhibiting a good result of 0.3 dB/cm.

In this example, both of the core and the clad were formed using the fluorene-unit-containing epoxy acrylate resin. This example is characterized in that the clad and the core were formed using the same material only by altering a UV dose. Such a process allows an optical waveguide to be prepared more conveniently than Example 9.

Figure 17:
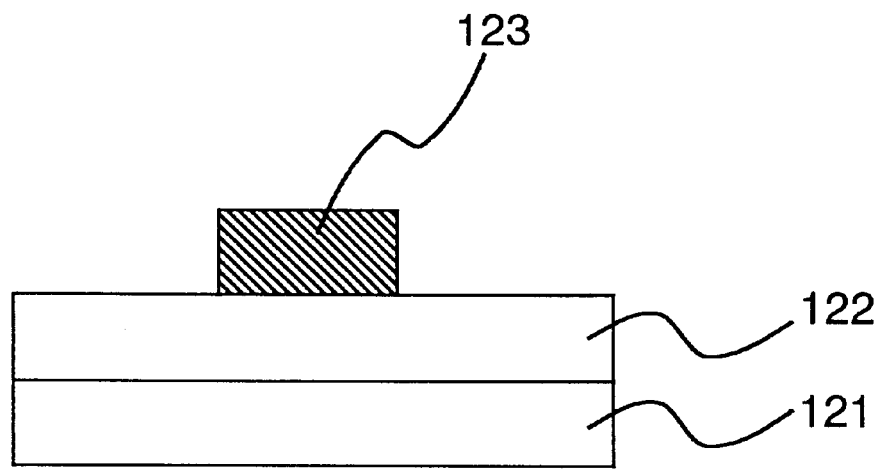
FIG. 17 is a cross section of a ridge type of optical waveguide of the third aspect according to this invention.

An optical waveguide may have any structure including a built-in structure as illustrated in FIG. 15 and a ridge structure as illustrated in FIG. 17 where a substrate 131 and a lower clad 132 are sequentially formed and a ridge-shaped core 133 is formed on the lower clad 132. The optical waveguide may be prepared by a dry process such as reactive ion etching, and may be etched by a known process.

What is claimed is:

1. A photo-electric structure comprising:
   a. an interconnection substrate having electrical interconnections formed on opposing surfaces and additional interconnections therebetween coupled by at least one interlayer via;
   b. a fine interconnection part positioned on top of said interconnection substrate and having an electric insulating layer and a conductor layer therein;
   c. an optical waveguide positioned on top of said interconnection substrate and separated from said fine interconnection part and having a core and a cladding; and
   d. wherein the electrical insulating layer of the fine interconnection part and the optical waveguide are made of the same material.

2. The photo-electric combined substrate as claimed in claim 1 where the interconnection substrate, the fine interconnection part and the optical waveguide part are formed as separate structures.

3. The photo-electric combined substrate as claimed in claim 1 where the material is a photosensitive resin whose refractive index depends on an exposure dose, and the core of the optical waveguide part is formed by scanning an irradiated light while focusing on a desired position in the photosensitive resin such that the refractive index of the part to be the core of the photosensitive resin is higher than that of the part to be the cladding of the photosensitive resin.

4. The photo-electric combined substrate as claimed in claim 1 where the substrate is selected from the group consisting of a ceramic substrate, a single-layer interconnection substrate and a multilayer interconnection substrate.

5. A photo-electric structure comprising:
   a. an interconnection substrate having electrical interconnections formed on opposing surfaces and additional interconnections therebetween coupled by at least one interlayer via;
   b. a fine interconnection part positioned on top of said interconnection substrate and having an electric insulating layer and a conductor layer therein;
   c. an optical waveguide positioned on top of said interconnection substrate and having a core and a cladding; and d. wherein the electrical insulating layer of the fine interconnection part and the optical waveguide are made of the same material.

6. The photo-electric combined substrate as claimed in claim 5 where the interconnection substrate, the fine interconnection part and the optical waveguide part are formed as separate structure.

7. The photo-electric combined substrate as claimed in claim 5 where the material is a photosensitive resin whose refractive index depends on an exposure dose, and the core of the optical waveguide is formed by scanning an irradiated light while focusing on a desired position in the photosensitive resin such that the refractive index of the optical waveguide core of the photosensitive resin is higher than that of the optical waveguide cladding of the photosensitive resin.

8. The photo-electric combined substrate as claimed in claim 5 where the substrate is selected from the group consisting of a ceramic substrate, a singly-layer interconnection substrate and a multilayer interconnection substrate.

9. A photo-electric structure comprising:
   a. an interconnection substrate having electrical interconnections formed on opposing surfaces and additional interconnections therebetween coupled by at least one interlayer via:
   b. a fine interconnection part on the whole upper surface of said interconnection substrate and having an electric insulating layer and a conductor layer therein;
   c. an optical waveguide formed in said fine interconnection part and having an optical-transmitting core and an optical-receiving core layer; and
   d. wherein the electrical insulating layer of the fine interconnection part and the optical waveguide are made of the same material.

10. The photo-electric combined substrate as claimed in claim 9 where the material is a photosensitive resin whose refractive index depends on an exposure dose, and both core layers of the optical waveguide are is formed by scanning an irradiated light while focusing on a desired position in the photosensitive resin such that the refractive index of the optical waveguide core layers of the photosensitive resin is higher than that of the surrounding electrical insulating layer of the fine interconnection part.

11. The photo-electric combined substrate as claimed in claim 9 where the substrate is selected from the group consisting of a ceramic substrate, a singly-layer interconnection substrate and a multilayer interconnection substrate.

* * * * *